United States Patent
Akagawa et al.

(10) Patent No.: US 10,164,215 B2
(45) Date of Patent: Dec. 25, 2018

(54) ELECTRO-OPTIC DEVICE THAT PREVENTS DETERIORATION OF A LIGHT EMITTING ELEMENT

(71) Applicant: SEIKO EPSON CORPORATION, Tokyo (JP)

(72) Inventors: Suguru Akagawa, Suwa (JP); Takefumi Fukagawa, Fujimi-machi (JP)

(73) Assignee: SEIKO EPSON CORPORATION, Tokyo (JP)

(*) Notice: Subject to any disclaimer, the term of this patent is extended or adjusted under 35 U.S.C. 154(b) by 456 days.

(21) Appl. No.: 14/298,008

(22) Filed: Jun. 6, 2014

(65) Prior Publication Data
US 2014/0367661 A1 Dec. 18, 2014

(30) Foreign Application Priority Data
Jun. 12, 2013 (JP) ................................ 2013-123468

(51) Int. Cl.
*H01L 51/52* (2006.01)
*H01L 27/32* (2006.01)

(52) U.S. Cl.
CPC ...... *H01L 51/5256* (2013.01); *H01L 51/5253* (2013.01); *H01L 27/322* (2013.01); *H01L 27/3276* (2013.01); *H01L 51/524* (2013.01); *H01L 51/5246* (2013.01); *H01L 2251/566* (2013.01)

(58) Field of Classification Search
CPC .............. H01L 51/5237; H01L 51/524; H01L 51/5243; H01L 51/5246; H01L 51/5253; H01L 51/5256
See application file for complete search history.

(56) References Cited

U.S. PATENT DOCUMENTS

| | | | |
|---|---|---|---|
| 2004/0212759 A1* | 10/2004 | Hayashi | H01L 51/5253 349/84 |
| 2005/0017633 A1 | 1/2005 | Miyadera | |
| 2005/0068474 A1* | 3/2005 | Su | H01L 27/322 349/69 |
| 2006/0158108 A1 | 7/2006 | Hayashi | |
| 2006/0158111 A1* | 7/2006 | Hayashi | H01L 51/5259 313/512 |
| 2006/0220548 A1 | 10/2006 | Menda | |
| 2006/0270305 A1* | 11/2006 | Imamura | H05B 33/04 445/25 |
| 2007/0114521 A1 | 5/2007 | Hayashi et al. | |

(Continued)

FOREIGN PATENT DOCUMENTS

| | | |
|---|---|---|
| JP | A-2004-119138 | 4/2004 |
| JP | A-2006-222071 | 8/2006 |

(Continued)

*Primary Examiner* — Hoai V Pham
(74) *Attorney, Agent, or Firm* — Oliff PLC

(57) ABSTRACT

An electro-optic device includes a substrate that has a first surface and an end face crossing the first surface; a light emitting element that is disposed on the first surface; a planarization layer that covers the light emitting element; and a first inorganic sealing layer that is disposed on the planarization layer. An outer edge of the first inorganic sealing layer is disposed between an outer edge of the planarization layer and a first region where the light emitting element is disposed.

18 Claims, 18 Drawing Sheets

(56) References Cited

U.S. PATENT DOCUMENTS

2010/0232162 A1* 9/2010 Shin .................... H01L 51/5284
362/293
2014/0117341 A1* 5/2014 Song .................. H01L 27/3246
257/40

FOREIGN PATENT DOCUMENTS

| JP | 2006-278139 A | 10/2006 |
| JP | 2007-141749 A | 6/2007 |
| JP | A-2011-53582 | 3/2011 |
| JP | A-2011-119169 | 6/2011 |
| JP | 2011-210544 A | 10/2011 |
| JP | 2012-209116 A | 10/2012 |
| JP | 2012-209215 A | 10/2012 |

\* cited by examiner

ELECTRO-OPTIC DEVICE THAT PREVENTS DETERIORATION OF A LIGHT EMITTING ELEMENT

BACKGROUND

1. Technical Field

The present invention relates to an electro-optic device, a method of manufacturing the electro-optic device, and an electronic apparatus equipped with the electro-optic device.

2. Related Art

Organic electroluminescence (EL) devices, which are examples of electro-optic devices, are self-emitting display devices, have advantages in a reduction in thickness and weight because a backlight as a light source is not necessary as compared with, for example, a non-emission type display device such as a liquid crystal device, and are expected to be applied as micro displays which are applied to an electronic view finder or the like. The organic EL device includes an organic EL element as a light emitting element, and the organic EL element is constituted by an anode, a cathode, a light emitting functional layer interposed between the anode and the cathode, and the like. The light emitting functional layer deteriorates due to oxygen, moisture (humidity), and the like, and thus the organic EL element is covered with a barrier film that blocks oxygen and moisture.

For example, in JP-A-2004-119138, a plurality of organic EL devices are formed in a supporting substrate (mother substrate) that is covered with a multilayer film in which an inorganic compound film (silicon oxynitride, silicon oxide, or the like) and a thermosetting resin (epoxy resin) are alternately laminated on each other, and then a segmentation line is irradiated with a laser to segment a mother substrate, thereby forming a simplex organic EL device. The organic EL element disposed in the organic EL device is covered with the multilayer film in which the inorganic compound film and the thermosetting resin are alternately laminated and a sealing film in which an inorganic compound film and an intermediate film are alternately laminated, and the influence of moisture on the organic EL element is blocked by the multilayer film and the sealing film, and thus it is possible to greatly improve the reliability of the organic EL element.

However, the method of JP-A-2004-119138 has a problem that it is difficult to completely block the influence of moisture.

In detail, the multilayer film in which the inorganic compound film (silicon oxynitride, silicon oxide, or the like) and the thermosetting resin (epoxy resin) are alternately laminated and the sealing film in which the inorganic compound film (silicon oxynitride, silicon oxide, or the like) and the intermediate film are laminated are formed across the above-described segmentation lines, and thus it is necessary to segment the multilayer film and the sealing film along the segmentation lines. The silicon oxynitride or the silicon oxide constituting the inorganic compound film is less flexible than, for example, the epoxy resin constituting the thermosetting resin, and thus a crack is likely to be generated due to stress or strain (deformation). When the mother substrate is divided along the segmentation lines, stress or strain is inevitably applied to the multilayer film or the sealing film near the segmentation lines, and thus a crack is more likely to be generated in the inorganic compound film constituting the multilayer film or the sealing film. There is a concern that moisture may infiltrate into the organic EL element through the crack, depending on a state of the crack.

Further, when the organic EL device is used for a long time, external stress such as heat or pressure is applied to the organic EL device, and thus the crack generated at the time of segmenting the mother substrate increases in size (grows), which leads to a concern that moisture may infiltrate into the organic EL element. That is, there is a problem of long-term reliability being deteriorated.

SUMMARY

The invention can be realized in the following forms and application examples.

Application Example 1

According to this application example, there is an electro-optic device including: a substrate that has a first surface and an end face crossing the first surface; a light emitting element that is disposed on the first surface; a planarization layer that covers the light emitting element; and a first inorganic sealing layer that is disposed on the planarization layer. An outer edge of the first inorganic sealing layer is disposed between an outer edge of the planarization layer and a first region where the light emitting element is disposed.

In this application example, the outer edge of the first inorganic sealing layer is disposed between the outer edge of the planarization layer and the first region where the light emitting element is disposed, that is, disposed so as to be separated from the end face (segmentation lines) of the substrate.

Since the outer edge of the first inorganic sealing layer is disposed so as to be separated from the segmentation lines, the influence of stress that advances an initial crack of the segmentation line is decreased, and thus a defect (crack or the like) is less likely to be generated in the first inorganic sealing layer due to the stress. Accordingly, the infiltration of moisture and oxygen into the light emitting element through the defect of the first inorganic sealing layer is suppressed, and the deterioration of the light emitting element due to the moisture and the oxygen is suppressed. Therefore, it is possible to improve long-term reliability of the electro-optic device.

Application Example 2

The electro-optic device according to the application example may further include a second inorganic sealing layer that covers the first region, between the light emitting element and the planarization layer. An outer edge of the second inorganic sealing layer may be disposed between the outer edge of the planarization layer and the first region.

The outer edge of the second inorganic sealing layer is disposed between the outer edge of the planarization layer and the first region where the light emitting element is disposed. That is, the outer edge of the second inorganic sealing layer is disposed so as to be separated from the end face (segmentation lines). Since the outer edge of the second inorganic sealing layer is disposed so as to be separated from the end face (segmentation lines), the influence of stress that advances an initial crack of the segmentation line is decreased, and thus a defect (crack or the like) is less likely to be generated in the second inorganic sealing layer due to the stress.

Application Example 3

In the electro-optic device according to the application example, the outer edge of the first inorganic sealing layer may be more than 0.1 mm away from the end face.

When an initial crack is formed along the segmentation lines in a mother substrate using a tool or the like and stress (tensile stress) advancing the initial crack is exerted to segment the mother substrate along the segmentation lines, a plane defect (conchoidal defect or the like) and a line defect (crack or the like) may be generated in the first surface of the substrate with an end face corresponding to the segmentation line as a base point. Many of the plane defects and the line defects are generated in a range of up to 0.1 mm with the end face as a base point. The outer edge of the first inorganic sealing layer is disposed more than 0.1 mm away from the end face, and thus it is possible to make it harder for a defect to be generated in the first inorganic sealing layer due to the plane defect and the line defect which are generated in the first surface of the substrate when segmenting the mother substrate.

Application Example 4

In the electro-optic device according to the application example, the outer edge of the second inorganic sealing layer may be more than 0.1 mm away from the end face.

The outer edge of the second inorganic sealing layer is disposed more than 0.1 mm away from the end face, and thus it is possible to suppress the influence of the plane defect and the line defect which are generated in the first surface of the substrate when segmenting the mother substrate. That is, it is possible to make it harder for a defect to be generated in the second inorganic sealing layer due to the plane defect and the line defect which are generated in the first surface of the substrate when segmenting the mother substrate.

Application Example 5

In the electro-optic device according to the application example, the first surface may have a first side, a second side and a third side which cross the first side, and a fourth side that faces the first side. A terminal, disposed on the first surface along the first side, may be provided between the first side and the first region. The outer edge of the planarization layer may be disposed between the first side and a second region where the terminal is disposed, between the second side and the first region, between the third side and the first region, and between the fourth side and the first region. The planarization layer may have an opening that exposes the terminal. The first inorganic sealing layer may have an outer edge along the first side, an outer edge along the second side, an outer edge along the third side, and an outer edge along the fourth side. The outer edge along the first side of the first inorganic sealing layer may be disposed between the first region and the second region. The outer edge along the second side, the outer edge along the third side, and the outer edge along the fourth side of the first inorganic sealing layer may be disposed between the end face and the first region.

The first surface of the element substrate main body has the first side, the second side and the third side which cross the first side, and the fourth side that faces the first side. In addition, the first side, the second side, the third side, and the fourth side correspond to the segmentation lines of the mother substrate. The outer edge of the planarization layer is disposed between the first side and the second region where the terminal is disposed, between the second side and the first region, between the third side and the first region, and between the fourth side and the first region. That is, the outer edge of the planarization layer is disposed so as to be separated from the segmentation lines. The outer edge along the first side of the first inorganic sealing layer is disposed between the first region and the second region. The outer edge along the second side, the outer edge along the third side, and the outer edge along the fourth side of the first inorganic sealing layer are disposed between the end face (the second side, the third side, and the fourth side) of the substrate main body and the first region. That is, the outer edge of the first inorganic sealing layer is disposed so as to be separated from the segmentation lines.

Since the outer edge of the planarization layer and the outer edge of the first inorganic sealing layer are disposed so as to be separated from the segmentation lines, the influence when segmenting the mother substrate, that is, the influence of stress that advances the initial crack of the segmentation line is decreased, and thus a defect (crack or the like) is less likely to be generated in the planarization layer and the first inorganic sealing layer due to the stress.

Application Example 6

In the electro-optic device according to the application example, the first surface may have a first side, a second side and a third side which cross the first side, and a fourth side that faces the first side. A terminal, disposed on the first surface along the first side, may be provided between the first side and the first region. The outer edge of the planarization layer and the outer edge of the first inorganic sealing layer may be disposed between the second region where the terminal is disposed and the first region, between the second side and the first region, between the third side and the first region, and between the fourth side and the first region.

The first surface of the element substrate main body has the first side, the second side and the third side which cross the first side, and the fourth side that faces the first side. In addition, the first side, the second side, the third side, and the fourth side correspond to the segmentation lines of the mother substrate. The outer edge of the planarization layer and the outer edge of the first inorganic sealing layer are disposed between the first region and the second region, between the second side and the first region, between the third side and the first region, and between the fourth side and the first region. That is, the outer edge of the planarization layer and the outer edge of the first inorganic sealing layer are disposed so as to be separated from the segmentation lines. Since the outer edge of the planarization layer and the outer edge of the first inorganic sealing layer are disposed so as to be separated from the segmentation lines, the influence when segmenting the mother substrate, that is, the influence of stress that advances the initial crack of the segmentation line is decreased, and thus a defect (crack or the like) is less likely to be generated in the planarization layer and the first inorganic sealing layer due to the stress.

Application Example 7

In the electro-optic device according to the application example, the first surface may have a first side, a second side and a third side which cross the first side, and a fourth side that faces the first side. A terminal, disposed on the first surface along the first side, may be provided between the first side and the first region. The outer edge of the second inorganic sealing layer may be disposed between the first side and the second region where the terminal is disposed, between the second side and the first region, between the third side and the first region, and between the fourth side and the first region. The second inorganic sealing layer may have an opening that exposes the terminal.

The first surface of the element substrate main body has the first side, the second side and the third side which cross the first side, and the fourth side that faces the first side. In addition, the first side, the second side, the third side, and the fourth side correspond to the segmentation lines of the mother substrate. The outer edge of the second inorganic sealing layer is disposed between the first side and the second region where the terminal is disposed, between the second side and the first region, between the third side and the first region, and between the fourth side and the first region. That is, the outer edge of the second inorganic sealing layer is disposed so as to be separated from the segmentation lines. Since the outer edge of the second inorganic sealing layer is disposed so as to be separated from the segmentation lines, the influence when segmenting the mother substrate, that is, the influence of stress that advances the initial crack of the segmentation line is decreased, and thus a defect (crack or the like) is less likely to be generated in the second inorganic sealing layer due to the stress.

Application Example 8

In the electro-optic device according to the application example, the first surface may have a first side, a second side and a third side which cross the first side, and a fourth side that faces the first side. A terminal, disposed on the first surface along the first side, may be provided between the first side and the first region. The outer edge of the second inorganic sealing layer may be disposed between the first region and the second region where the terminal is disposed, between the second side and the first region, between the third side and the first region, and between the fourth side and the first region.

The first surface of the element substrate main body has the first side, the second side and the third side which cross the first side, and the fourth side that faces the first side. In addition, the first side, the second side, the third side, and the fourth side correspond to the segmentation lines of the mother substrate. The outer edge of the second inorganic sealing layer is disposed between the first region and the second region, between the second side and the first region, between the third side and the first region, and between the fourth side and the first region. That is, the outer edge of the second inorganic sealing layer is disposed so as to be separated from the segmentation lines. Since the outer edge of the second inorganic sealing layer is disposed so as to be separated from the segmentation lines, the influence when segmenting the mother substrate, that is, the influence of stress that advances the initial crack of the segmentation line is decreased, and thus a defect (crack or the like) is less likely to be generated in the second inorganic sealing layer due to the stress.

Application Example 9

The electro-optic device according to the application example may further include a protection substrate that is disposed above the first inorganic sealing layer so as to cover the first region, and an adhesion layer that is disposed between the first inorganic sealing layer and the protection substrate. The first inorganic sealing layer may be covered with the adhesion layer.

The protection substrate is disposed above the first inorganic sealing layer so as to cover the first region, the adhesion layer is disposed between the first inorganic sealing layer and the protection substrate, and the first inorganic sealing layer is covered with the adhesion layer. When an initial crack (cutting line) is formed in the segmentation line of the mother substrate using a tool, offcuts (cullet) may be generated and scattered. Even in this case, since the first inorganic sealing layer is covered with the adhesion layer, the first inorganic sealing layer is less likely to be damaged due to the scattering of the offcuts (cullet). Further, since the protection substrate is disposed above the first inorganic sealing layer so as to cover the first region (region where the light emitting element is disposed), the first inorganic sealing layer is less likely to be damaged by virtue of the protection substrate, and thus it is possible to strongly suppress the infiltration of moisture and oxygen into the light emitting element.

Application Example 10

The electro-optic device according to the application example may further include a color filter that has a red colored layer, a green colored layer, and a blue colored layer, on the first inorganic sealing layer. The first inorganic sealing layer may be covered with at least one of the red colored layer, the green colored layer, and the blue colored layer.

The first inorganic sealing layer is covered with at least one of the red colored layer, the green colored layer, and the blue colored layer. When an initial crack (cutting line) is formed in the segmentation line of the mother substrate using a tool, offcuts (cullet) may be generated and scattered. Even in this case, since the first inorganic sealing layer is covered with the colored layer, the first inorganic sealing layer is less likely to be damaged due to the scattering of the offcuts (cullet).

Application Example 11

The electro-optic device according to the application example may further include a protection substrate that is disposed above the color filter so as to cover the first region, and an adhesion layer that is disposed between the color filter and the protection substrate.

Since the protection substrate is disposed above the colored layer (color filter), covering the first inorganic sealing layer, so as to cover the first region (region where the light emitting element is disposed), the first inorganic sealing layer of the first region is less likely to be damaged by virtue of the protection substrate, and thus it is possible to strongly suppress the infiltration of moisture and oxygen into the light emitting element.

Application Example 12

In the electro-optic device according to the application example, the planarization layer may be constituted by any one of a metal oxide formed of polysilazane or formed by a sol-gel method and an epoxy resin.

The planarization layer is constituted by any one of a metal oxide formed of polysilazane or formed by a sol-gel method and an epoxy resin. The metal oxide and the epoxy resin have a dense film structure as compared with, for example, a hydrocarbon system polymer such as polyethylene, polystyrene, or polypropylene, and have an excellent barrier property against moisture and oxygen. The planarization layer is constituted by the metal oxide or the epoxy resin, and thus it is possible to improve the barrier property against moisture and oxygen as compared with a case where the planarization layer is constituted by a hydrocarbon system polymer.

Application Example 13

In the electro-optic device according to the application example, the Young's modulus of the planarization layer may be equal to or less than 100 GPa. The Young's modulus of the first inorganic sealing layer may be in a range of 140 GPa to 200 GPa.

The planarization layer (having the Young's modulus of equal to or less than 100 GPa) is formed of a material that is more flexible than that of the first inorganic sealing layer (having the Young's modulus of 140 GPa to 200 GPa), and can be formed to be thick so as to make it harder for a crack to be generated. Since the planarization layer can be formed to be thick, the influence such as the bending of the substrate or foreign substances is reduced, and thus a flat surface can be formed. For example, when foreign substances are attached to the light emitting element, the foreign substances can be buried (covered) with the planarization layer. The first inorganic sealing layer is a hard (dense) film having the Young's modulus of 140 GPa to 200 GPa, and has an excellent barrier property against oxygen and moisture as compared with the planarization layer. The first inorganic sealing layer is formed in the surface becoming flat by a reduction in the influence such as the bending of the substrate or foreign substances, that is, the surface of the planarization layer, and thus a defect is less likely to be generated in the first inorganic sealing layer, thereby allowing a barrier property against moisture and oxygen to be increased.

Application Example 14

According to this application example, there is provided an electronic apparatus including the electro-optic device according to the above-described application example.

The electronic apparatus according to this application example includes the electro-optic device according to the above-described application example. In the electro-optic device, the deterioration of the light emitting element is suppressed by the planarization layer and the first inorganic sealing layer, and long-term reliability is excellent. For example, the electro-optic device according to the above-described application example is applied to a display unit of an electronic apparatus such as a head mounted display, a digital camera, a personal computer, a portable information terminal, a navigator, a viewer, or a head-up display, and thus it is possible to realize a stable display that is excellent in long-term reliability.

Application Example 15

According to this application example, there is provided a method of manufacturing an electro-optic device that includes a substrate, including a light emitting element, a planarization layer, and a first inorganic sealing layer, a protection substrate that is disposed so as to face the substrate, and an adhesion layer that is disposed between the substrate and the protection substrate. The method includes forming the planarization layer that covers a first region where the light emitting element is disposed; forming the first inorganic sealing layer that covers at least a portion of the planarization layer so that an outer edge is disposed between the first region and an outer edge of the planarization layer; performing oxygen plasma processing on the first inorganic sealing layer; and disposing an adhesive material between the first inorganic sealing layer and the protection substrate, hardening the adhesive material while pressing the protection substrate to form the adhesion layer that covers the first inorganic sealing layer, and attaching the protection substrate to the substrate through the adhesion layer.

In the method of manufacturing the electro-optic device according to this application example, the first inorganic sealing layer is formed so that the outer edge is disposed between the first region where the light emitting element is disposed and the outer edge of the planarization layer, the oxygen plasma processing is performed on the first inorganic sealing layer, the adhesive material is disposed between the first inorganic sealing layer and the protection substrate, the adhesion layer covering the first inorganic sealing layer is formed, and the protection substrate is attached to the substrate through the adhesion layer. The surface of the first inorganic sealing layer is reformed by oxygen plasma, and thus the adhesion layer can uniformly cover the first inorganic sealing layer with stable bonding strength. Further, the protection substrate is disposed (bonded) in the first inorganic sealing layer through the adhesion layer. Accordingly, the first inorganic sealing layer is more strongly protected by the adhesion layer and the protection substrate, and thus the first inorganic sealing layer is less likely to be damaged.

Application Example 16

According to this application example, there is provided a method of manufacturing an electro-optic device using a mother substrate in which a plurality of electro-optic devices are disposed, each of the electro-optic devices having a light emitting element, a planarization layer, and a first inorganic sealing layer which are sequentially laminated. The method includes forming the planarization layer, covering the light emitting element, in the mother substrate across segmentation lines that segment the mother substrate into the simplex electro-optic devices; forming the first inorganic sealing layer, facing the light emitting element with the planarization layer interposed therebetween, in each of the plurality of disposed electro-optic devices so as to be more than 0.1 mm away from the segmentation lines; and segmenting the mother substrate along the segmentation lines.

In the method of manufacturing the electro-optic device according to this application example, in a state where the first inorganic sealing layer suppressing the deterioration of the light emitting element is formed in each of the plurality of electro-optic devices disposed in the mother substrate so as to be more than 0.1 mm away from the segmentation lines, the mother substrate is segmented along the segmentation lines to form the simplex electro-optic devices. Since the first inorganic sealing layer is more than 0.1 mm away from the segmentation line, the influence of stress exerted for the segmentation along the segmentation lines is decreased, and thus a defect is less likely to be generated in the first inorganic sealing layer due to the stress.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings. These embodiments are illustrative of an aspect of the invention, are not intended to limit the invention, and can be arbitrarily modified within the scope of a technical idea of the invention. In addition, in the following drawings, layers and parts are shown in sizes that are recognizable on the drawings, and thus the scales of the layers and parts are different from the actual scales thereof.

First Embodiment

Outline of Organic EL Device

An organic EL device 100 according to a first embodiment is an example of an electro-optic device, displays a monochrome image, and can be suitably used in a display unit such as a head mounted display (HMD) to be described later or a digital camera.

Figure 1:
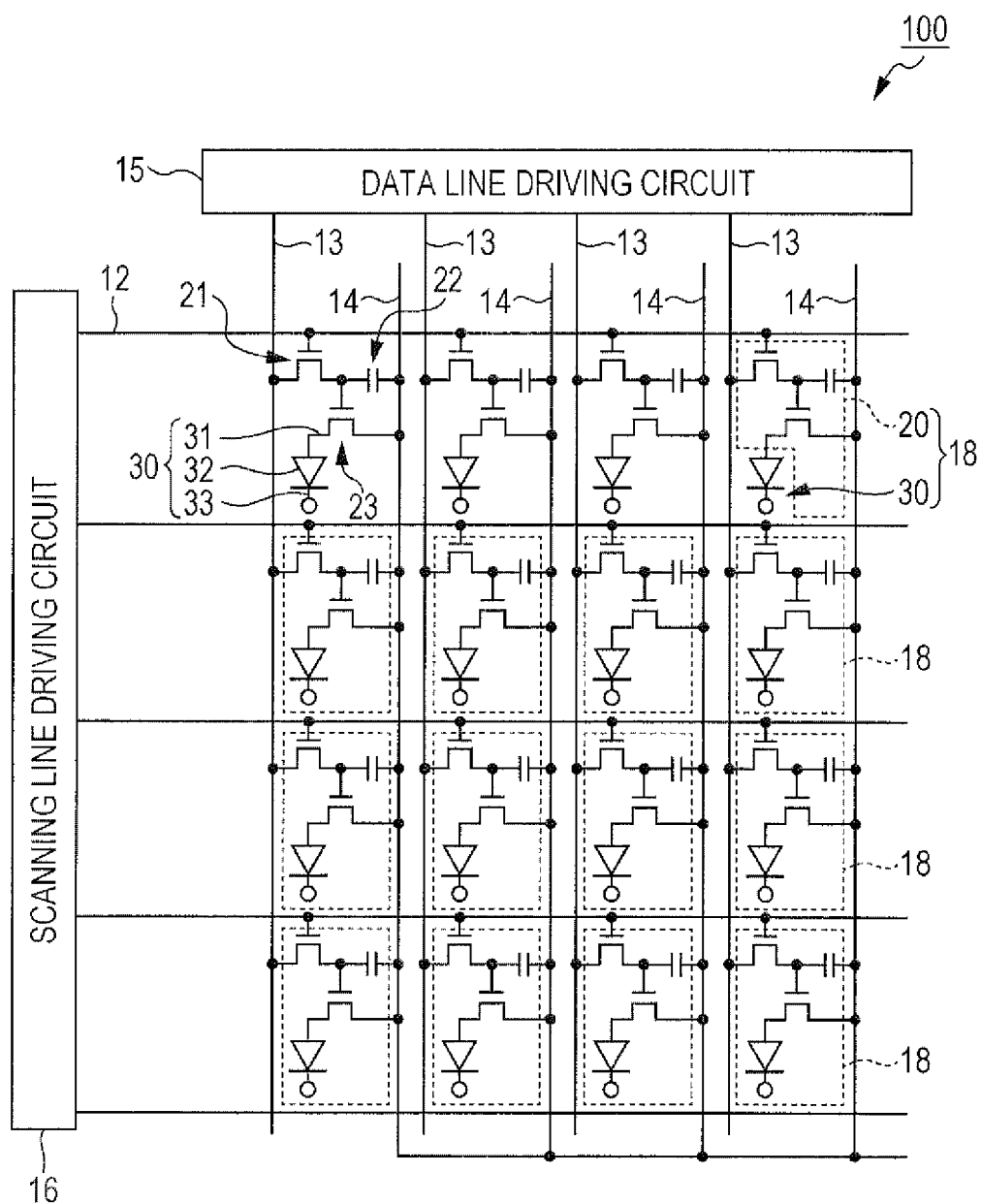
FIG. 1 is an equivalent circuit diagram showing the electrical configuration of an organic EL device according to a first embodiment.
Figure 2:
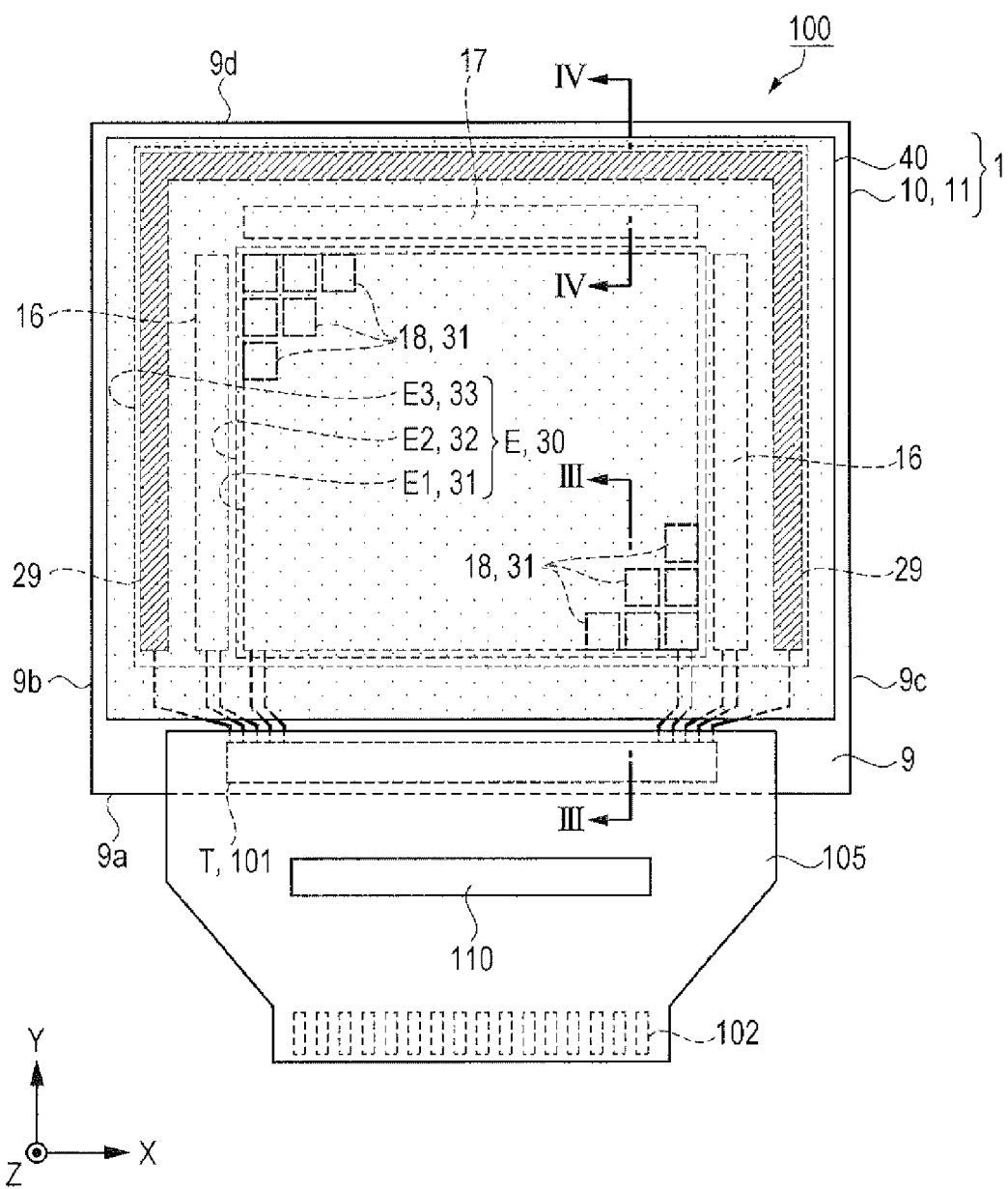
FIG. 2 is a schematic plan view showing the configuration of the organic EL device according to the first embodiment.

First, an outline of the organic EL device 100 according to this embodiment will be described with reference to FIGS. 1 and 2. FIG. 1 is an equivalent circuit diagram showing the electrical configuration of the organic EL device according to this embodiment. FIG. 2 is a schematic plan view showing the configuration of the organic EL device according to this embodiment.

As shown in FIG. 1, the organic EL device 100 according to this embodiment includes a plurality of scanning lines 12 and a plurality of data lines 13 which cross each other, and a plurality of power lines 14 which are arrayed in parallel with the respective plurality of data lines 13. The scanning lines 12 are connected to a scanning line driving circuit 16, and the data lines 13 are connected to a data line driving circuit 15. In addition, pixels 18 are disposed in a matrix so as to correspond to the respective crossing portions between the plurality of scanning lines 12 and the plurality of data lines 13.

The pixel 18 includes an organic EL element 30 which is a light emitting element, and a pixel circuit 20 that controls the driving (emission) of the organic EL element 30.

The organic EL element 30 includes a pixel electrode 31 functioning as an anode, a counter electrode 33 functioning as a cathode, and a light emitting functional layer 32 that includes an organic light emitting layer provided between the pixel electrode 31 and the counter electrode 33. The organic EL element 30 can be electrically denoted as a diode, and the light emitting functional layer 32 emits light by a current flowing to the organic EL element 30. In detail, holes are supplied to the light emitting functional layer 32 from the pixel electrode 31, electrons are supplied to the light emitting functional layer 32 from the counter electrode 33, the holes and the electrons are coupled to each other in the light emitting functional layer 32, and the light emitting functional layer 32 emits white light.

The organic EL element 30 is an example of a "light emitting element" in the invention.

The pixel circuit 20 includes a switching transistor 21, a storage capacitor 22, and a driving transistor 23. Two transistors 21 and 23 can be configured using, for example, an n-channel type or p-channel type thin film transistor (hereinafter, referred to as "TFT").

A gate of the switching TFT 21 is connected to the scanning line 12. Any one of a source and a drain of the switching TFT 21 is connected to the data line 13. The other one of the source and the drain of the switching TFT 21 is connected to a gate of the driving TFT 23.

Any one of a source and a drain of the driving TFT 23 is connected to the pixel electrode 31 of the organic EL element 30. The other one of the source and the drain of the driving TFT 23 is connected to the power line 14. The storage capacitor 22 is connected between the gate of the driving TFT 23 and the power line 14.

When the scanning line 12 is driven and the switching TFT 21 is set to be in an ON state, a potential based on an image signal, supplied from the data line 13 at that time, is held in the storage capacitor 22 through the switching TFT 21. In response to a potential of the storage capacitor 22, that is, a gate potential of the driving TFT 23, ON and OFF states of the driving TFT 23 are determined. When the driving TFT 23 is set to be in an ON state, a current having the amount based on the gate potential flows to the light emitting functional layer 32 interposed between the pixel electrode 31 and the counter electrode 33 from the power line 14 through the driving TFT 23. The organic EL element 30 emits light based on the amount of current flowing to the light emitting functional layer 32.

As shown in FIG. 2, the organic EL device 100 is constituted by an organic EL panel 1, a flexible circuit substrate (hereinafter, referred to as FPC) 105, and the like.

The organic EL panel 1 includes an element substrate 10 (an element substrate main body 11), a protection substrate 40 that is disposed so as to face the element substrate 10, and the like.

The element substrate 10 includes the element substrate main body 11 which is a base material. The pixel 18 (the organic EL element 30), the scanning line driving circuit 16, the data line driving circuit 15, the scanning lines 12, the data lines 13, the power lines 14, and the like, which are described above, are disposed on a plane 9 on the side facing the protection substrate 40 of the element substrate main body 11.

The element substrate main body 11 is formed of, for example, a light transmissive material such as quartz or glass. Meanwhile, the element substrate main body 11 may not have light transmittance or may be formed of, for example, an opaque material such as silicon or ceramic. The element substrate 10 is larger than the protection substrate 40, and one side of the element substrate main body 11 greatly protrudes from the protection substrate 40. Hereinafter, the one side of the element substrate main body 11 which greatly protrudes from the protection substrate 40 is referred to as a first side 9a. Sides which cross (are perpendicular to) the first side 9a are referred to as a second side 9b and a third side 9c, and a side facing the first side 9a is referred to as a fourth side 9d. In addition, a region (surface) surrounded by the first side 9a, the second side 9b, the third side 9c, and the fourth side 9d is the plane 9 on the side facing the protection substrate 40 of the element substrate main body 11.

The element substrate main body 11 is an example of the "substrate" in the invention. The plane 9 on the side facing the protection substrate 40 of the element substrate main body 11 is an example of a "first surface" in the invention, and is referred to as the surface 9.

Further, a description will be given assuming that a direction along the first side 9a and the fourth side 9d is an X direction, a direction along the second side 9b and the third side 9c is a Y direction, and a direction, perpendicular to the X direction and the Y direction, which is directed toward the protection substrate 40 from the element substrate 10 is a Z direction.

As described above, the organic EL element 30 includes the pixel electrode 31, the light emitting functional layer 32, and the counter electrode 33.

The pixel electrodes 31 are disposed in a matrix in the X direction and the Y direction and form a pixel electrode region E1. That is, the pixel electrode 31 is disposed in the form of an islet for each pixel 18. The pixel circuit 20 (the switching TFT 21, the storage capacitor 22, the driving TFT 23, and the like) is provided for each pixel 18 so as to correspond to the pixel electrode 31. The light emitting functional layer 32 coming into contact with the pixel electrode 31 emits white light in association with the operation of the pixel circuit 20. A region where the pixel electrode 31 is disposed, that is, the pixel electrode region E1 is a display region where an image is displayed.

The light emitting functional layer 32 is disposed so as to cover the pixel electrode region E1. A region where the light emitting functional layer 32 is disposed is a light emitting functional layer region E2. When viewed from the Z direction, the light emitting functional layer region E2 covers the pixel electrode region E1 and is disposed to be wider than the pixel electrode region E1.

The counter electrode 33 is disposed so as to cover the light emitting functional layer region E2. A region where the counter electrode 33 is disposed is a counter electrode region E3. When viewed from the Z direction, the counter electrode region E3 covers the light emitting functional layer region E2 and is disposed to be wider than the light emitting functional layer region E2.

A light emitting element region E is constituted by the pixel electrode region E1, the light emitting functional layer region E2, and the counter electrode region E3. When viewed from the Z direction, the counter electrode region E3 is formed to be widest, and thus the counter electrode region E3 is the light emitting element region E.

Meanwhile, the light emitting element region E is an example of a "first region" in the invention.

A plurality of terminals 101 are arrayed in the X direction on the surface 9 of the element substrate main body 11 of the portion that greatly protrudes from the protection substrate 40. A region where the terminals 101 are disposed is a terminal region T. The scanning line driving circuit 16 is disposed between the second side 9b and the pixel electrode region E1 and between the third side 9c and the pixel electrode region E1. A scanning circuit 17 is disposed between the fourth side 9d and the pixel electrode region E1.

A wiring layer 29 is disposed between the second side 9b and the scanning line driving circuit 16, between the third side 9c and the scanning line driving circuit 16, and between the fourth side 9d and the scanning circuit 17. In other words, the wiring layer 29 is disposed so as to surround two scanning line driving circuits 16 and the scanning circuit 17. The above-described counter electrode region E3 is disposed so as to overlap the wiring layer 29 and to cover the wiring layer 29 when viewed from the Z direction. A contact hole 46 (see FIG. 4) for electrically connecting the wiring layer 29 to the counter electrode 33 is provided in a region where the counter electrode region E3 overlaps the wiring layer 29.

As described above, the organic EL element 30 is a light emitting element that emits light based on the amount of current flowing through the light emitting functional layer 32. The greatest amount of current flows through the counter electrode 33 that is disposed across the plurality of pixel electrodes 31. For example, when a wiring resistance of a wiring (cathode wiring) constituted by the wiring layer 29 increases and a current supplied to the counter electrode 33 decreases, there is a problem in that the luminance of the organic EL element 30 decreases (becomes dark). For this reason, a wiring width of a cathode wiring of the wiring layer 29 is larger (wider) than that of another wiring.

The protection substrate 40 is formed of, for example, a light transmissive material such as quartz or glass, is smaller than the element substrate 10, and is disposed so as to face the element substrate 10. The protection substrate 40 is disposed so as to cover the light emitting element region E. As a result, the organic EL element 30 is disposed between the element substrate main body 11 and the protection substrate 40, and is isolated from external atmosphere by the protection substrate 40. In other words, the protection substrate 40 has a role of protecting the organic EL element 30 so as not to be mechanically impacted and not to be affected by external atmosphere.

A driving IC 110 including the data line driving circuit 15 mentioned above is mounted on the FPC 105. The FPC 105 includes an input terminal 102 connected to an input side of the driving IC 110 through a wiring and an output terminal (not shown) connected to an output side of the driving IC 110 through a wiring. The FPC 105 is connected to the terminal region T (the terminal 101) on the element substrate 10 side. The data lines 13, the power lines 14, the scanning line driving circuits 16, the scanning circuit 17, and the wiring layer 29 (the counter electrode 33) on the element substrate 10 side mentioned above are electrically connected to the driving IC 110 through the terminal 101 and the FPC 105, and a predetermined signal is supplied thereto.

Outline of Organic EL Panel

Next, an outline of the organic EL panel 1 will be described with reference to FIG. 3 to FIG. 5.

Figure 3:
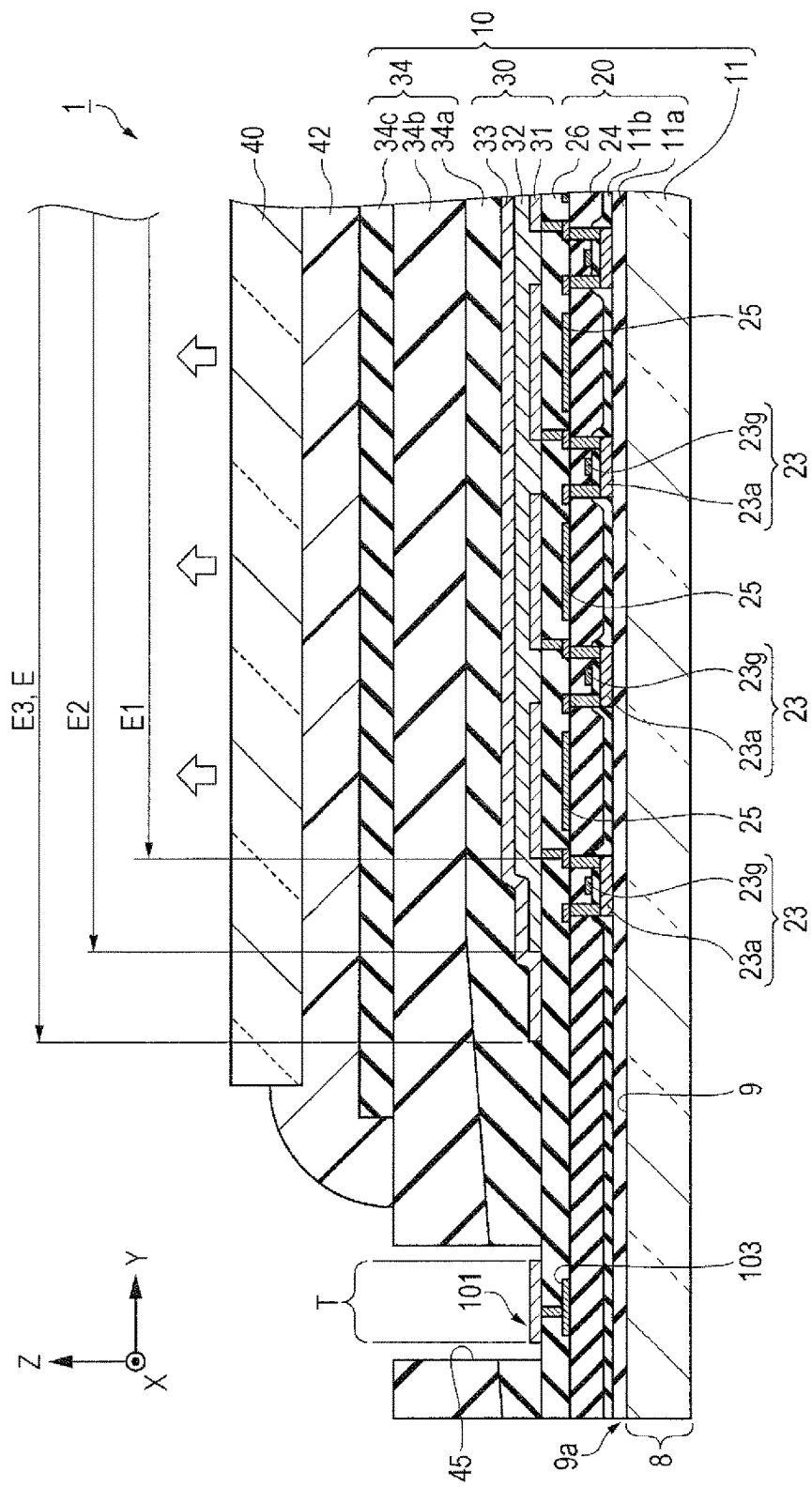
FIG. 3 is a schematic cross-sectional view showing the structure of an organic EL panel taken along line III-III of FIG. 2.

FIG. 3 is a schematic cross-sectional view showing the structure of the organic EL panel taken along line III-III of FIG. 2. FIG. 4 is a schematic cross-sectional view showing the structure of the organic EL panel taken along line IV-IV of FIG. 2. FIG. 5 is a schematic plan view of the terminal region.

Figure 4:
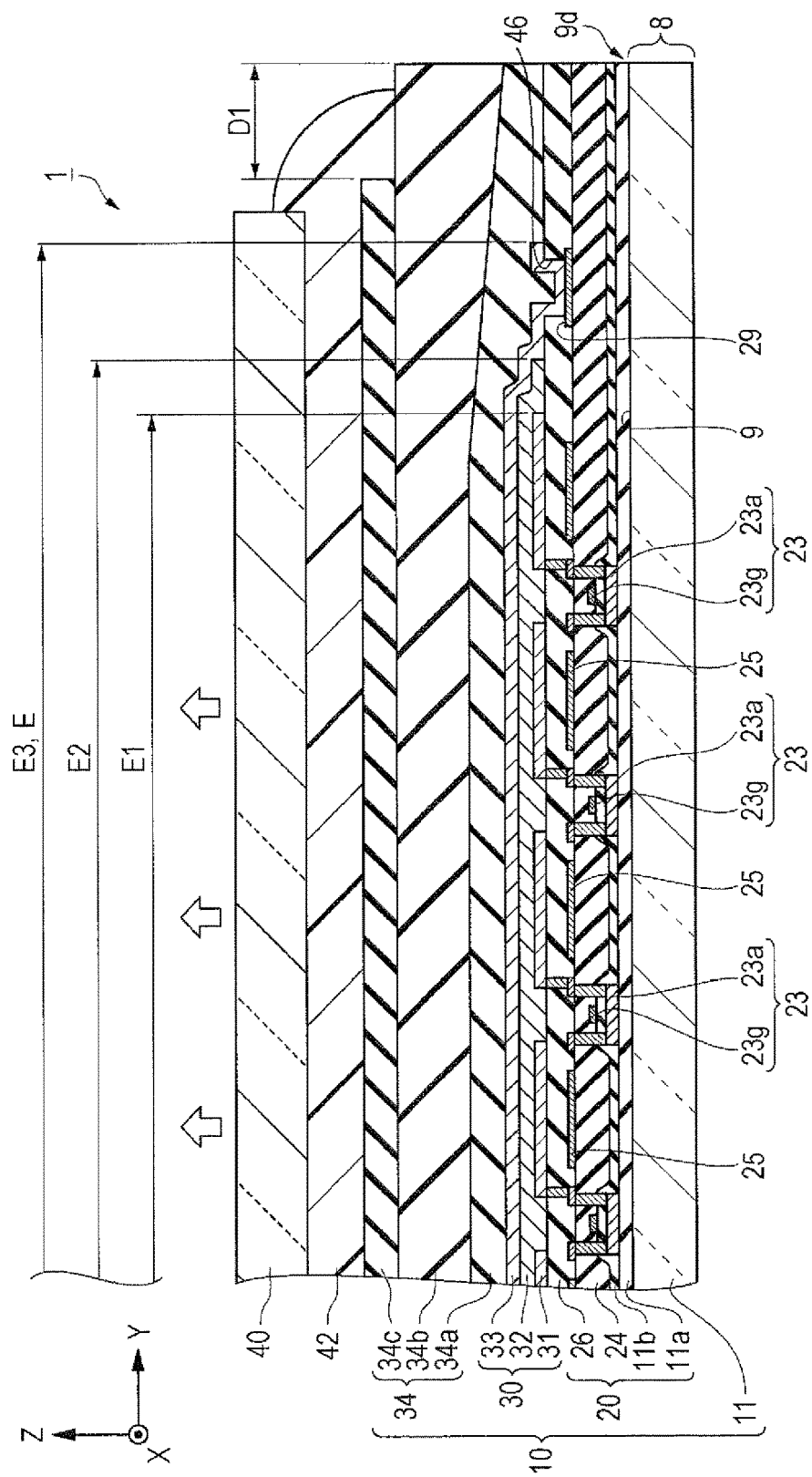
FIG. 4 is a schematic cross-sectional view showing the structure of the organic EL panel taken along line 1V-1V of FIG. 2.
Figure 5:
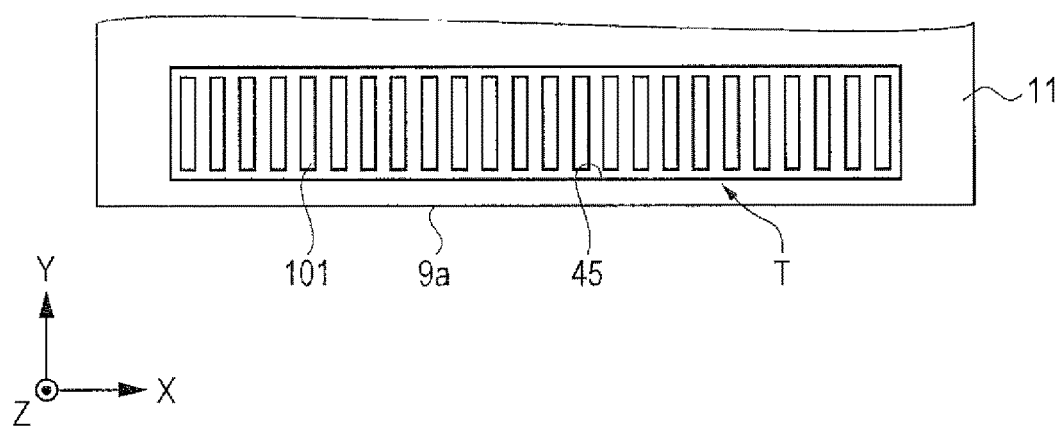
FIG. 5 is a schematic plan view of a terminal region of the organic EL device according to the first embodiment.

Components (the driving TFT 23, the terminal 101, and the wiring layer 29) which are necessary for the description of the invention are shown, and components (the scanning circuit 17, the switching TFT 21, the storage capacitor 22, and the like) which are unnecessary for the description of the invention are not shown in FIGS. 3 and 4. In addition, arrows in FIGS. 3 and 4 indicate an emission direction of light emitted from the light emitting functional layer 32. FIG. 5 also shows only components which are necessary for the description of the invention.

As shown in FIGS. 3 and 4, the organic EL panel 1 includes the element substrate 10, the protection substrate 40, a transparent resin layer 42 that bonds the element substrate 10 to the protection substrate 40, and the like. The transparent resin layer 42 has light transmittance, is formed of, for example, an epoxy resin, and bonds the element substrate 10 to the protection substrate 40. As described above, the protection substrate 40 has light transmittance, and is formed of a light transmissive material, for example, quartz or glass. Light emitted from the element substrate 10 (the organic EL element 30) passes through the transparent resin layer 42 and the protection substrate 40 and is emitted in the direction of an arrow (Z direction). That is, the organic EL panel 1 has a top emission structure in which light emitted from the element substrate 10 is emitted from the protection substrate 40 side.

The pixel circuit 20, the organic EL element 30, and the sealing layer 34 are sequentially laminated on the surface 9 of the element substrate main body 11 which is a base material of the element substrate 10. In addition, the element substrate main body 11 has an end face 8 that crosses the surface 9. Regions (sides) where the end face 8 crosses the surface 9 are the first side 9a (FIG. 3), the second side 9b (not shown), the third side 9c (not shown), and the fourth side 9d (FIG. 4).

Pixel Circuit

The pixel circuit 20 is constituted by an insulation film, a semiconductor film, a conducting layer, and the like which are disposed from a first insulation film 11a to a second interlayer insulating film 26. By these components, a wiring layer 103, the wiring layer 29, the driving TFT 23, the switching TFT 21 (not shown), the storage capacitor 22 (not shown), the scanning circuit 17 (not shown), the scanning line driving circuit 16 (not shown), and the like are formed.

The surface 9 of the element substrate main body 11 is covered with the first insulation film 11a. A semiconductor layer 23a is disposed on the first insulation film 11a. The semiconductor layer 23a is covered with a second insulation film 11b that functions as a gate insulation film. A gate electrode 23g is disposed at a position facing a channel region of the semiconductor layer 23a through the second insulation film 11b. The driving TET 23 is constituted by the semiconductor layer 23a, the second insulation film 11b (gate insulation film), the gate electrode 23g, and the like. The gate electrode 23g is covered with a first interlayer insulating film 24. A contact hole is disposed in the second insulation film 11b and the first interlayer insulating film 24. Electrodes (source electrode and drain electrode) are electrically connected to the driving TFT 23 through the contact hole. The electrodes are formed of, for example, a light reflective material such as aluminum or an aluminum alloy. Further, the reflecting layer 25, the wiring layer 103, the wiring layer 29, and the like which are formed of the same material as those of the electrodes are disposed in the same layer as the electrode.

The first interlayer insulating film 24 is covered with the second interlayer insulating film 26. A contact hole for electrically connecting the pixel electrode 31 and the driving TFT 23 is disposed in the second interlayer insulating film 26. The materials to be used which constitute the first insulation film 11a, the second insulation film 11b, the first interlayer insulating film 24, and the second interlayer insulating film 26 may include, for example, a silicon oxide, a silicon nitride, a silicon oxynitride, and the like.

Organic EL Element

The organic EL element 30 is constituted by the pixel electrode 31, the light emitting functional layer 32, and the counter electrode 33 which are sequentially laminated on the second interlayer insulating film 26.

The pixel electrode 31 is an electrode for supplying holes to the light emitting functional layer 32. The pixel electrode 31 has light transmittance and is formed of, for example, a light transmissive material such as indium tin oxide (ITO). The pixel electrode 31 overlaps the reflecting layer 25 in a planar manner, and is disposed in the form of an islet in each of the plurality of pixels 18. The pixel electrode 31 is electrically connected to the driving TFT 23 through the contact hole formed in the second interlayer insulating film 26. The region where the pixel electrode 31 is disposed is the pixel electrode region E1.

The light emitting functional layer 32 is disposed so as to cover the pixel electrode 31, and has a hole injection layer, a hole transfer layer, an organic light emitting layer, an electron transfer layer, and the like which are sequentially laminated from the pixel electrode 31 side. The holes supplied from the pixel electrode 31 and the electrons supplied from the counter electrode 33 are coupled to each other in the organic light emitting layer, and the light emitting functional layer 32 performs emission (emits light). The region where the light emitting functional layer 32 is disposed is the light emitting functional layer region E2.

The organic light emitting layer emits light having red, green, and blue light components, that is, white light. The organic light emitting layer may be constituted by a single layer or may be constituted by a plurality of layers (for example, a blue light emitting layer that mainly emits blue light when a current flows and a yellow light emitting layer that mainly emits light including a red color and a green color when a current flows).

The counter electrode 33 is a common electrode for supplying electrons to the light emitting functional layer 32. The counter electrode 33 is disposed so as to cover the light emitting functional layer 32, is formed of, for example, an alloy of Mg and Ag, and has light transmittance and light reflectivity. The alloy constituting the counter electrode 33 is formed into a thin film, and thus the counter electrode can be given a light transmissive function in addition to a light reflective function.

The light emitted from the light emitting functional layer 32 is emitted in a Z-axis (+) direction as shown by arrows in the drawing, and becomes display light. Light in a Z-axis (−) direction which is emitted from the light emitting functional layer 32 is reflected by the reflecting layer 25 in the Z-axis (+) direction, and becomes a portion of display light.

Terminal and Wiring

The wiring layer 29 is covered with the second interlayer insulating film 26. The second interlayer insulating film 26 is provided with the contact hole 46 that exposes the wiring layer 29. The counter electrode 33 is disposed so as to cover the contact hole 46, is electrically connected to the wiring layer 29 through the contact hole 46, and is electrically connected to the terminal 101 through the wiring layer 29.

The terminal 101 formed of the same material as that of the pixel electrode 31 is provided between the second interlayer insulating film 26 and a first inorganic sealing layer 34a. The first inorganic sealing layer 34a and a planarization layer 34b to be described later are provided with an opening 45 that exposes the terminal 101. The terminal 101 is electrically connected to the wiring layer 103 through the contact hole provided in the second interlayer insulating film 26. The pixel circuit 20, the scanning line driving circuit 16, and the scanning circuit 17 are electrically connected to the terminal 101 through the wiring layer 103.

As described above, the plurality of terminals 101 are disposed in the X direction along the first side 9a of the element substrate main body 11. As shown in FIG. 5, the opening 45 is provided so as to expose all the plurality of terminals 101 that are disposed along the X direction. The region where the terminals 101 are disposed is the terminal region T.

Sealing Layer

The sealing layer 34 is a passivation film that suppresses the deterioration of the light emitting functional layer 32 and the counter electrode 33, and suppresses the infiltration of moisture and oxygen into the light emitting functional layer 32 and the counter electrode 33. For this reason, the sealing layer 34 covers the light emitting element region E (the counter electrode region E3) and is disposed to be wider than the light emitting element region E.

The sealing layer 34 is constituted by the first inorganic sealing layer 34a, the planarization layer 34b, and the second inorganic sealing layer 34c which are sequentially laminated from the counter electrode 33 side.

Meanwhile, the first inorganic sealing layer 34a is an example of the "second inorganic sealing layer" in the invention. The second inorganic sealing layer 34c is an example of the "first inorganic sealing layer" in the invention.

The first inorganic sealing layer 34a is formed of a silicon oxynitride that is formed using, for example, a plasma chemical vapor deposition (CVD) method which is a well-known technique. The film thickness of the first inorganic sealing layer 34a is approximately 0.1 μm to 1 μm. The Young's modulus of the first inorganic sealing layer 34a is approximately 160 GPa. The first inorganic sealing layer 34a covers the counter electrode 33 and is disposed across the entire region of the surface 9 of the element substrate 10. The first inorganic sealing layer 34a is provided with the opening 45 that exposes the terminal 101. The first inorganic sealing layer 34a has a high barrier property to suppress the infiltration of moisture and oxygen, and thus the infiltration of moisture and oxygen into the organic EL element 30 (the pixel electrode 31, the light emitting functional layer 32, and the counter electrode 33) is suppressed (blocked) by the first inorganic sealing layer 34a.

In order to increase the barrier property of the first inorganic sealing layer 34a against moisture and oxygen, it is preferable that the first inorganic sealing layer 34a be formed of a dense and hard film. For this reason, a material having the Young's modulus of 140 GPa to 200 GPa is suitable for the material constituting the first inorganic sealing layer 34a. The materials to be used which constitute the first inorganic sealing layer 34a may include a silicon oxide, a silicon nitride, and the like, in addition to the silicon oxynitride mentioned above.

The planarization layer 34b is formed of, for example, a metal oxide that is formed by a sol-gel method using an alcoxide compound as a raw material. Specifically, the planarization layer is formed of a silicon oxide, including siloxane (Si—O—Si) bonding as its main component, which is formed by performing a dehydrative condensation reaction of tetraalkoxysilane (Si(OR).sub.4), organic trialkoxysilane (R'Si(OR).sub.3), and the like. In more detail, the silicon oxide (the planarization layer 34b) including siloxane bonding as its main component is formed by applying a solution having an alcoxide compound using a method such as spin coating, printing, or ink jet printing and by transferring liquid (sol) to solid (gel) by the dehydrative condensation reaction. For example, when organic trialkoxysilane (R'Si(OR).sub.3) is used as the alcoxide compound, an organic material (R') is incorporated into the silicon oxide, and thus it is possible to adjust the Young's modulus of the planarization layer 34b. The planarization layer 34b includes an organic/inorganic hybrid film in which an inorganic material (Si) and an organic material are conjugated at the level of a molecule.

The film thickness of the planarization layer 34b is larger than the film thickness of the first inorganic sealing layer 34a, and is approximately 1 μm to 2 μm. The Young's modulus of the planarization layer 34b is approximately 60 GPa. The planarization layer 34b covers the first inorganic sealing layer 34a and is disposed across the entire region of the surface 9 of the element substrate 10. The planarization layer 34b is provided with the opening 45 that exposes the terminal 101.

The planarization layer 34b is formed of a material that is more flexible than that of the first inorganic sealing layer 34a, and thus a crack is less likely to be generated, and the planarization layer can be formed to be thick. For example, the influence of bending of the element substrate main body 11 is reduced by the planarization layer 34b. For example, when foreign substances causing a defect in the first inorganic sealing layer 34a are present, the foreign substances are buried (covered) with the planarization layer 34b and thus do not exert adverse influences on the second inorganic sealing layer 34c. Even if a recessed defect such as a pinhole or a crack is generated in the first inorganic sealing layer 34a, the recessed defect is covered with the planarization layer 34b, and thus does not exert adverse influences on the second inorganic sealing layer 34c.

In this manner, defective locations such as the foreign substances and the recessed defect (pinhole or crack) of the first inorganic sealing layer 34a are covered with the planarization layer 34b, and thus a flat surface is formed. The second inorganic sealing layer 34c is formed on the surface that becomes flat by the planarization layer 34b, and thus a defect is less likely to be generated in the second inorganic sealing layer 34c. In this manner, the planarization layer 34b is disposed between the first inorganic sealing layer 34a and the second inorganic sealing layer 34c, and thus it is possible to suppress a defect of the sealing layer 34 and to remarkably enhance the barrier property of the sealing layer 34.

In order to cover the defective locations such as the foreign substances and the recessed defect of the first inorganic sealing layer 34a with the planarization layer 34b, it is preferable to form the planarization layer 34b by a wet method (spin coating, printing, ink jet printing, or the like) of forming a film (solid) from a solution (liquid). For example, a dry method (for example, plasma CVD) of forming a film (solid) from a source gas (gas) by which the first inorganic sealing layer 34a is formed has a lower step coverage than the wet method such as spin coating or printing, and it is difficult to cover the defective locations completely (without a defect).

Further, in order to cover the foreign substances, it is necessary to form the planarization layer 34b to be thick. For this reason, it is preferable that the planarization layer 34b be formed of a flexible material that is less likely to cause a crack even if the planarization layer is formed to be thick. Specifically, it is preferable that the planarization layer 34b be formed of a material having the Young's modulus of equal to or less than 100 GPa.

When the planarization layer 34b is formed of a metal oxide that is formed by the sol-gel method mentioned above, the planarization layer has an excellent barrier property against moisture and oxygen, as compared with a case where the planarization layer is formed of a hydrocarbon system polymer. Accordingly, when the metal oxide that is formed by a sol-gel method is used as the planarization layer 34b, it is possible to obtain an effect of suppressing the influence of moisture and oxygen in addition to an effect of burying (covering) the foreign substances.

A metal oxide formed of a solution including a silazane compound, an epoxy resin formed of a resin solution, or the like can be used in the planarization layer 34b, in addition to the above-described metal oxide formed by a sol-gel method.

For example, a solution that includes a silazane compound having a silazane structure (Si—N) is applied by a method such as spin coating, printing, or ink jet printing, a polysilazane film is formed, the polysilazane film is irradiated with light and heat, and nitrogen in the polysilazane film is substituted with oxygen by active oxygen, ozone, or the like, and thus it is possible to form a silicon oxide having an excellent density property (excellent barrier property against moisture and oxygen). Further, the epoxy resin formed by applying the resin solution through printing or the like is a dense film having an excellent barrier property against moisture and oxygen, as compared with a hydrocarbon system polymer.

The second inorganic sealing layer 34c is formed of, for example, a silicon oxynitride that is formed using a plasma CVD method which is a well-known technique. The film thickness of the second inorganic sealing layer 34c is approximately 0.1 μm to 1 μm. The Young's modulus of the second inorganic sealing layer 34c is approximately 160 GPa. That is, the second inorganic sealing layer 34c is formed of the same material as that of the first inorganic sealing layer 34a and has a high barrier property against moisture and oxygen.

In order to increase the barrier property against moisture and oxygen, it is preferable that the second inorganic sealing layer 34c be formed of a dense and hard film. For this reason, it is preferable that the second inorganic sealing layer 34c be formed of a material having the Young's modulus of 140 GPa to 200 GPa. A silicon oxide, a silicon nitride, or the like can be used in the second inorganic sealing layer 34c, in addition to the silicon oxynitride mentioned above.

As shown in FIG. 3, an outer edge of the second inorganic sealing layer 34c is disposed between the terminal region T and the light emitting element region E and protrudes from the protection substrate 40.

As shown in FIG. 4, the outer edge of the second inorganic sealing layer 34c is disposed between the fourth side 9d (the end face 8) of the element substrate main body 11 and the light emitting element region E and protrudes from the protection substrate 40. Further, although not shown in the drawing, the outer edge of the second inorganic sealing layer 34c is disposed between the second side 9b (the end face 8) of the element substrate main body 11 and the light emitting element region E and between the third side 9c (the end face 8) of the element substrate main body 11 and the light emitting element region E, and protrudes from the protection substrate 40.

In other words, the outer edge of the second inorganic sealing layer 34c is positioned between an outer edge of the planarization layer 34b and the light emitting element region E.

A distance D1 between the fourth side 9d and the outer edge of the second inorganic sealing layer 34c is equal to or greater than 0.1 mm. Further, similarly, a distance between the second side 9b and the outer edge of the second inorganic sealing layer 34c and a distance between the third side 9c and the outer edge of the second inorganic sealing layer 34c are equal to or greater than 0.1 mm.

Method of Manufacturing Organic EL Panel

Figure 6:
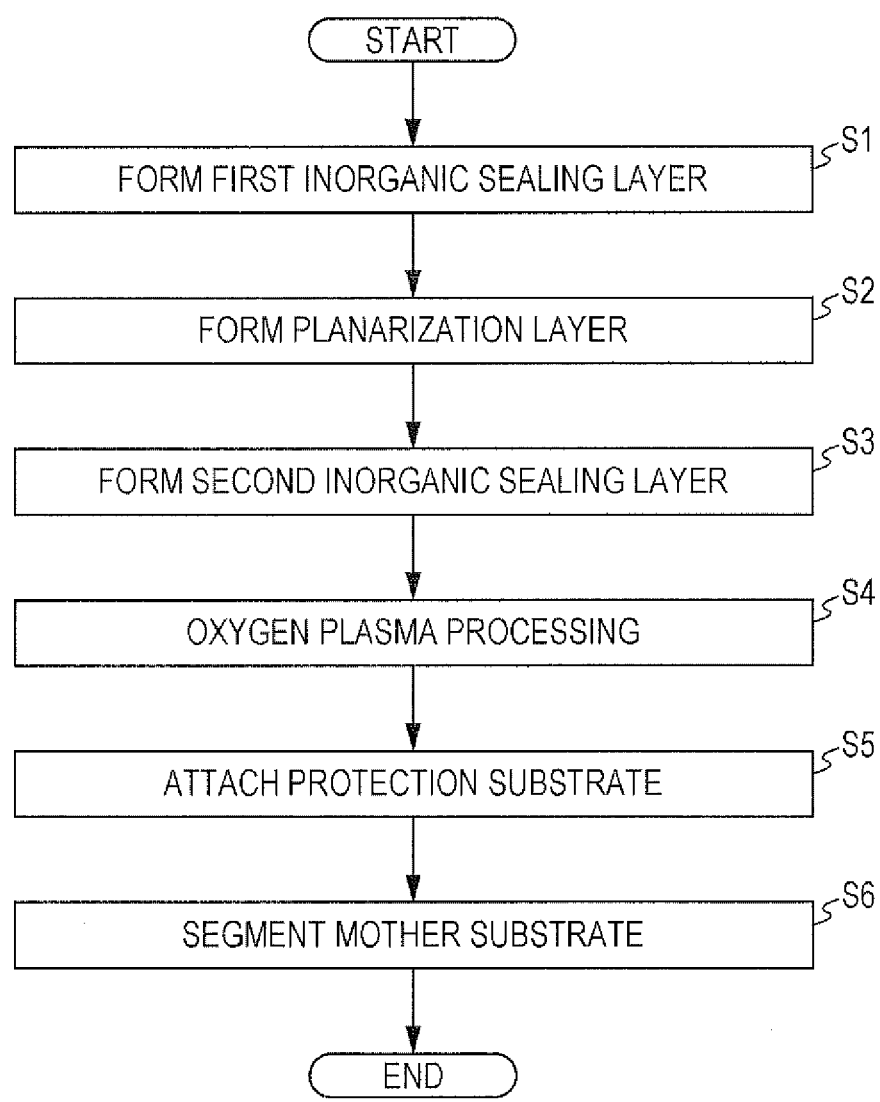
FIG. 6 is a process flow showing an outline of a method of manufacturing an organic EL panel.
Figure 7:
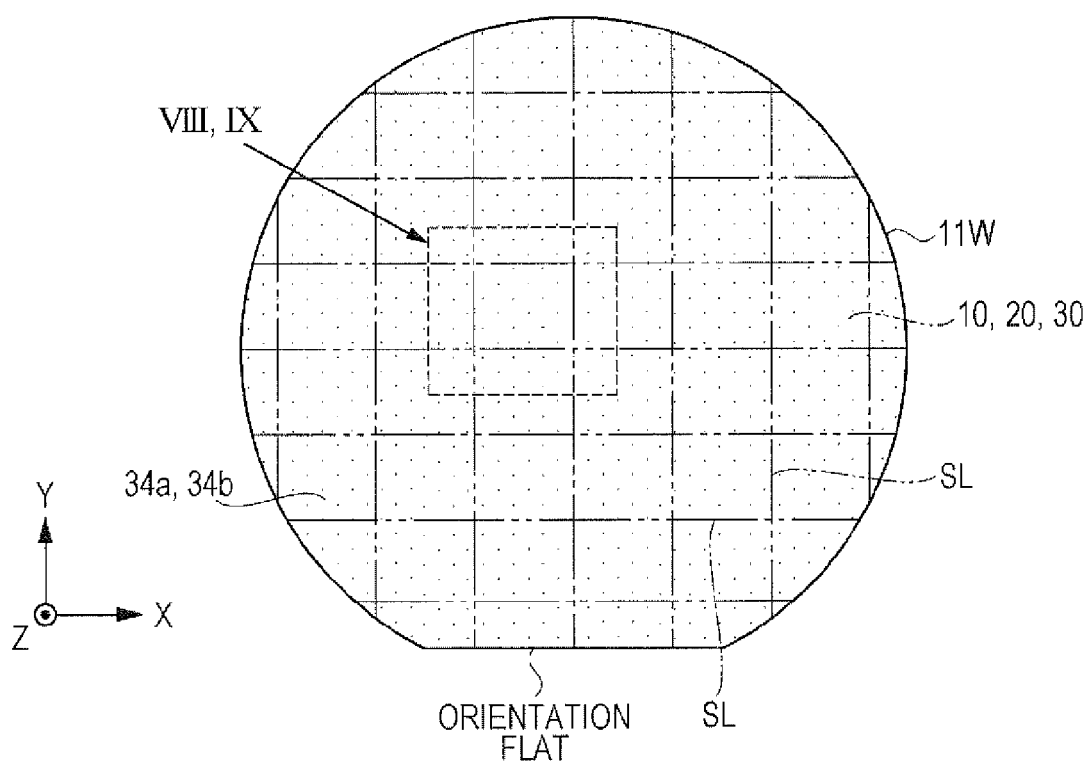
FIG. 7 is a schematic plan view showing the state of the organic EL panel after going through a principal process of FIG. 6.
Figure 8A:
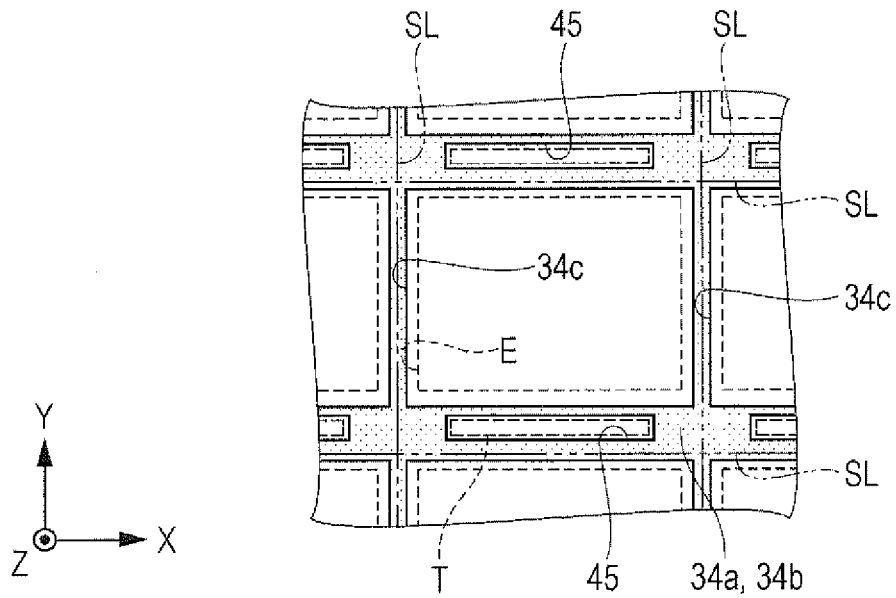
FIGS. 8A and 8B are schematic plan views showing the state of the organic EL panel after going through a principal process of FIG. 6.
Figure 8B:
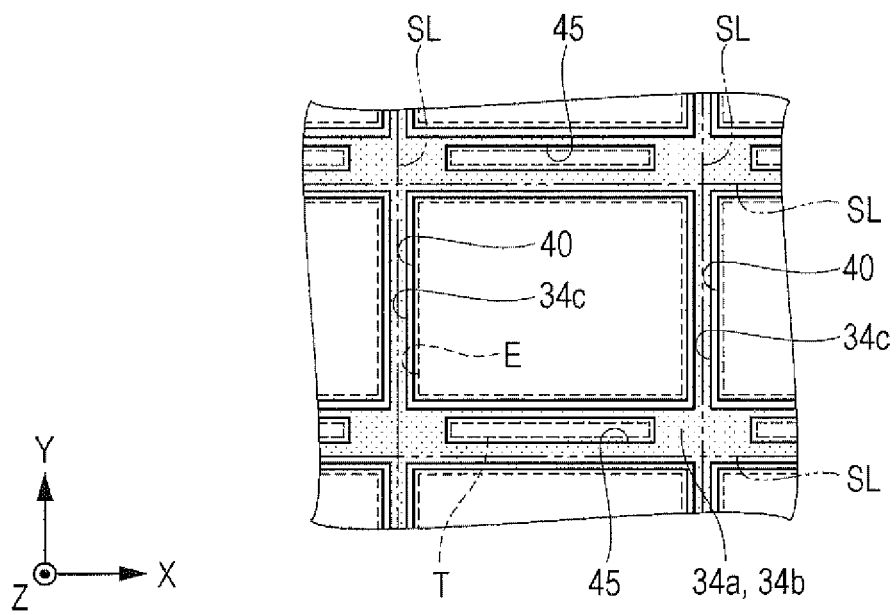
Figure 9:
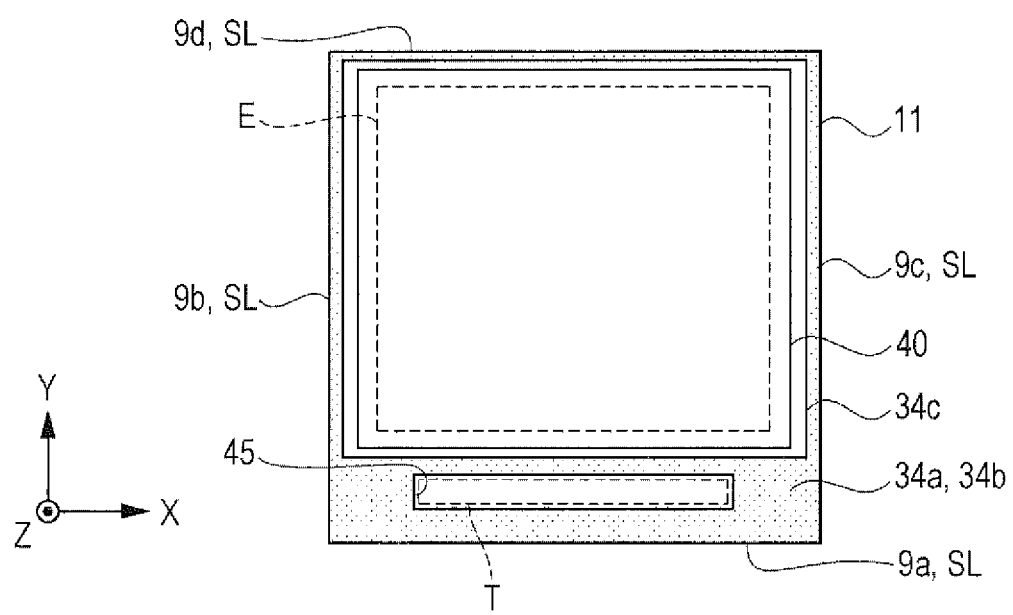
FIG. 9 is a schematic plan view showing the state of the organic EL panel after going through a principal process of FIG. 6.

FIG. 6 is a process flow showing an outline of a method of manufacturing an organic EL panel which is of the feature of the invention. FIGS. 7 to 9 are schematic plan views showing a state of the organic EL panel after going through a principal process of FIG. 6. FIG. 7 shows a state of a mother substrate 11W in which the plurality of element substrates 10 are attached in a multifaceted manner. FIGS. 8A and 8B and FIG. 9 show an enlarged view of a region indicated by a dotted line VIII, IX in FIG. 7. In addition, FIGS. 7 to 9 show components necessary for the description of each process, and do not show components unnecessary for the description of each process.

Hereinafter, an outline of a method of manufacturing the organic EL panel 1 will be described with reference to FIGS. 6 to 9. Processes other than the processes shown in FIG. 6 use a well-known technique and will not be described.

The processes from the process of forming the first inorganic sealing layer 34a shown in FIG. 6 (step S1) to the process of segmenting the mother substrate 11W (step S6) are of the features of the method of manufacturing the organic EL panel 1 according to this embodiment, and other processes use a well-known technique.

In step S1 of FIG. 6, a silicon oxynitride having a thickness of 0.1 μm to 1 μm is accumulated on the entire surface of the element substrate 10 in which the pixel circuit 20, the organic EL element 30, and the like are formed, using a plasma CVD method which is a well-known technique, to form the first inorganic sealing layer 34a.

In step S2 of FIG. 6, a silicon oxide (the planarization layer 34b) having a thickness of 1 μm to 2 μm is formed on the entire surface of the element substrate 10 in which the first inorganic sealing layer 34a is formed, by a sol-gel method using alkoxysilane such as tetramethoxysilane or tetraethoxysilane. In the sol-gel method, an alkoxysilane solution is applied to the mother substrate 11W by a method such as spin coating, printing, or ink jet printing. Thus, for example, even if foreign substances are present in the mother substrate 11W, the foreign substances can be buried (covered) with the silicon oxide (the planarization layer 34b).

Subsequently, the planarization layer 34b and the first inorganic sealing layer 34a of the terminal region T are etched and removed using a photoresist as an etching mask by a dry etching method which is a well-known technique to form the opening 45 (see FIGS. 3 and 4) which exposes the terminal 101. Meanwhile, the photoresist used as the etching mask is removed after etching the planarization layer 34b and the first inorganic sealing layer 34a.

FIG. 7 shows a state after the planarization layer 34b of step S2 is formed (state before the opening 45 is formed). A two-dot chain line in the drawing indicates a segmentation line SL. A region surrounded by the two-dot chain lines is the simplex element substrate 10. A half-tone dot meshing region in the drawing indicates a region in which the first inorganic sealing layer 34a and the planarization layer 34b are formed.

As shown in FIG. 7, the mother substrate 11W is, for example, a wafer-shaped quartz substrate and has an orientation flat in which a portion of an outer circumference is notched. The mother substrate 11W is provided with the plurality of element substrates 10 (the element substrate 10 in which the pixel circuit 20 and the organic EL element 30 are formed) in the X direction and the Y direction on the basis of the orientation flat. The first inorganic sealing layer 34a and the planarization layer 34b are formed on substantially the entire surface of the mother substrate 11W across the segmentation lines SL. Meanwhile, in step S6 to be described later, the mother substrate 11W is segmented along the segmentation lines SL to be divided into the simplex organic EL panels 1 (the element substrates 10). In other words, the segmentation lines SL are the first side 9a, the second side 9b, the third side 9c, and the fourth side 9d of the element substrate main body 11 in step S6 to be described later.

In step S3 of FIG. 6, a silicon oxynitride having a thickness of 0.1 μm to 1 μm is accumulated using a plasma CVD method which is a well-known technique, to form the second inorganic sealing layer 34c.

FIG. 8A shows a state after going through the step S3. In plasma CVD of step S3, a silicon oxynitride is accumulated in a predetermined region using a metal mask, to form the second inorganic sealing layer 34c. The outer edge of the second inorganic sealing layer 34c is disposed between the terminal region T and the light emitting element region E and between the segmentation line SL and the light emitting element region E. The second inorganic sealing layer 34c is formed in the form of an islet in each of the plurality of element substrates 10 that are disposed in the mother substrate 11W. Both the sizes in the X direction and the Y direction of a region where the second inorganic sealing layer 34c is not formed are equal to or greater than 0.2 mm. The segmentation line SL is disposed in the center of a region that is not covered with the second inorganic sealing layer 34c. That is, a distance between the segmentation line SL and the second inorganic sealing layer 34c is equal to or greater than 0.1 mm, except for the side on which the terminal region T is disposed. In other words, the outer edge of the second inorganic sealing layer 34c is disposed more than 0.1 mm away from the segmentation lines SL.

In step S4 of FIG. 6, the second inorganic sealing layer 34c and the planarization layer 34b that is not covered with the second inorganic sealing layer 34c are subjected to oxygen plasma processing. The surfaces of the second inorganic sealing layer 34c and the planarization layer 34b which is not covered with the second inorganic sealing layer 34c are reformed (activated) by the oxygen plasma processing to improve the wettability of an adhesive (epoxy resin) to be used in step S5. For example, even if the second inorganic sealing layer 34c is contaminated by an organic material, a contamination (organic material) can be removed by oxygen plasma processing.

Meanwhile, in step S4, UV processing or ozone processing may be performed instead of the oxygen plasma processing.

In step S5 of FIG. 6, an adhesive material (epoxy resin) is applied to the second inorganic sealing layer 34c to attach the simplex protection substrate 40 to each of the plurality of element substrates 10 that are disposed in the mother substrate 11W, by a so-called chip mount method.

FIG. 8B shows a state after going through step S5. By step S5, the protection substrate 40 is attached to a predetermined position. That is, the protection substrate 40 is attached to each of the plurality of element substrates 10 that are disposed in the mother substrate 11W so that the outer edge of the second inorganic sealing layer 34c is disposed between an outer edge of the protection substrate 40 and the segmentation lines SL.

In step S5, the protection substrate 40 is irradiated with UV rays and heat while pressing the protection substrate to harden an epoxy resin, and thus the transparent resin layer 42 that bonds the element substrate 10 to the protection substrate 40 is formed. In step S4, since the wettability of an adhesive (epoxy resin) with respect to the second inorganic sealing layer 34c and the planarization layer 34b is improved, the transparent resin layer 42 is formed so as to cover the second inorganic sealing layer 34c. The plurality of organic EL panels 1 each constituted by the element substrate 10, the transparent resin layer 42, and the protection substrate 40 are formed in the mother substrate 11W.

In step S6 of FIG. 6, the mother substrate 11W in which the plurality of organic EL panels 1 are formed is segmented along the segmentation lines SL to form the simplex organic EL panels 1. Specifically, after an initial crack (cutting line) is formed in the segmentation line SL using a cutter wheel, the mother substrate 11w is segmented by bending (by exerting tensile stress) the mother substrate 11W. Besides the segmentation method using the cutter wheel (scribing processing), a segmentation method of irradiating the segmentation lines SL with a laser beam (local heating) and then rapidly cooling the segmentation lines to exert stress on the segmentation lines SL (laser processing) or a method of segmenting (cutting) the mother substrate 11W along the segmentation line SL by using a dicing blade (dicing processing) may be used, for example.

FIG. 9 is a schematic plan view of the simplex organic EL panel 1 showing a state after going through step S6. As described above, the first side 9a, the second side 9b, the third side 9c, and the fourth side 9d of the element substrate main body 11 (the end face 8 of the element substrate main body 11) correspond to the segmentation lines SL in the mother substrate 11W. As shown in FIG. 9, the first inorganic sealing layer 34a and the planarization layer 34b are sequentially disposed (laminated) on the entire region of the element substrate main body 11. The second inorganic sealing layer 34c is disposed on the planarization layer 34b. The outer edge of the second inorganic sealing layer 34c is disposed so as to be separated from the end face 8 (the segmentation lines SL of the mother substrate 11W) of the element substrate main body 11. The protection substrate 40 is disposed above the second inorganic sealing layer 34c. An end face of the protection substrate 40 is disposed between the outer edge of the second inorganic sealing layer 34c and the light emitting element region E. That is, the outer edge of the second inorganic sealing layer 34c protrudes from the end face of the protection substrate 40. Further, the transparent resin layer 42 is disposed between the second inorganic sealing layer 34c and the protection substrate 40, and the second inorganic sealing layer 34c is covered with the transparent resin layer 42 (see FIGS. 3 and 4).

As shown in FIGS. 3 and 4, the element substrate main body 11, the first insulation film 11a, the second insulation film 11b, the first interlayer insulating film 24, the second interlayer insulating film 26, the first inorganic sealing layer 34a, and the planarization layer 34b are sequentially laminated on the end face 8 of the element substrate main body 11 (region corresponding to the segmentation lines SL of the mother substrate 11W). The element substrate main body 11 is formed of a hard brittle material (quartz). The first insulation film 11a, the second insulation film 11b, the first interlayer insulating film 24, the second interlayer insulating film 26, and the first inorganic sealing layer 34a are also formed of a hard brittle material (a silicon oxide, a silicon nitride, a silicon oxynitride, or the like). On the other hand, the planarization layer 34b is formed of a more flexible material than that of the first inorganic sealing layer 34a, that is, a material having the Young's modulus of equal to or less than 100 GPa. Further, the second inorganic sealing layer 34c disposed on the planarization layer 34b is formed of the same material as that of the first inorganic sealing layer 34a, that is, a hard brittle material.

In the above-described scribing processing and dicing processing, a blade edge tool is directly pressed against the mother substrate 11W to mechanically process the mother substrate 11W, and thus minute offcuts (cullet) are generated (scattered). Further, stress (tensile stress) is exerted along the segmentation lines SL to perform segmentation into the simplex organic EL panels 1 along the segmentation lines SL.

Also in the laser processing, an initial crack serving as a base point of crack advance is required to be provided by mechanical processing, and thus cullets are generated (scattered) by the mechanical processing. Further, stress (tensile stress) that advances a crack having an initial crack as a base point is exerted to perform segmentation into the simplex organic EL panels 1 along the segmentation lines SL.

As described above, in the methods such as the scribing processing, the dicing processing, and the laser processing, the mother substrate 11W and the components (the pixel circuit 20, the organic EL element 30, and the sealing layer 34) which are disposed on the surface 9 of the mother substrate 11W are more or less affected by stress along the segmentation lines SL.

For example, when an initial crack (the segmentation line SL) is provided in a component formed of a hard brittle material and stress (tensile stress) advancing the initial crack is applied to the component, the plastic deformation of the component formed of the hard brittle material occurs, and thus brittle fracture (segmentation) along the segmentation lines SL occurs. On the other hand, when stress (tensile stress) is applied to the planarization layer 34b formed of a material having the Young's modulus of equal to or less than 10 GPa in a direction in which the initial crack is advanced, the plastic deformation of the planarization layer 34b occurs after the elastic deformation thereof, and thus ductile fracture (segmentation) occurs along the segmentation lines SL. That is, the planarization layer 34b is deformed during the advance of the crack to the planarization layer 34b.

Assuming that the second inorganic sealing layer 34c is disposed across the segmentation lines SL, the planarization layer 34b disposed under the second inorganic sealing layer 34c is deformed by stress along the segmentation lines SL, and thus the second inorganic sealing layer 34c is deformed in a similar manner. However, since the second inorganic sealing layer 34c is formed of a hard brittle material, the plastic deformation of the second inorganic sealing layer 34c occurs, and thus a crack is generated in the second inorganic sealing layer 34c. There is a concern that a barrier property of the sealing layer 34 may be greatly decreased due to the crack generated in the second inorganic sealing layer 34c.

In this embodiment, since the second inorganic sealing layer 34c is disposed so as to be separated from the segmentation lines SL, the second inorganic sealing layer is less likely to be affected by the deformation of the planarization layer 34b along the segmentation lines SL. That is, a crack is less likely to be generated in the second inorganic sealing layer 34c by the deformation of the planarization layer 34b. Accordingly, it is possible to suppress a decrease in the barrier property of the sealing layer 34 in the process of segmenting the mother substrate 11W of step SE.

As described above, when the segmentation line SL (initial crack) is formed in the mother substrate 11W, minute offcuts (cullet) are scattered. Since the second inorganic sealing layer 34c is covered with the transparent resin layer 42, a damage of the second inorganic sealing layer 34c due to the cullet is suppressed.

In the above-described scribing processing, when an object (the mother substrate 11W) formed of a hard brittle material such as quartz or glass is segmented along the segmentation lines SL, for example, a conchoidal defect (plane defect) or a crack (line defect) is generated in the surface 9 of the element substrate main body 11 with the end face 8 (the segmentation line SL) of the element substrate main body 11 as a base point. The plane defect or the line defect is generated in a range of less than 0.1 mm from the segmentation lines SL. Since the second inorganic sealing layer 34c is more than 0.1 mm away from the segmentation lines SL, the influence of the plane defect or the line defect which is generated in the surface 9 of the element substrate main body 11 is suppressed.

As described above, the following effects can be obtained in this embodiment.

(1) The outer edge of the second inorganic sealing layer 34c is disposed more than 0.1 mm away from the segmentation lines SL, and thus it is possible to suppress the influence of stress occurring near the segmentation lines SL (the influence of the deformation of the planarization layer 34b) when segmenting the mother substrate 11W into the simplex organic EL panels 1 along the segmentation lines SL and to suppress the generation of a new defect in the second inorganic sealing layer 34c.

(2) The outer edge of the second inorganic sealing layer 34c is disposed more than 0.1 mm away from the segmentation lines SL, and thus it is possible to suppress the generation of a new defect in the second inorganic sealing layer 34c due to the plane defect (conchoidal defect or the like) or the line defect (crack or the like) which is generated in the surface 9 of the element substrate main body 11 with the end face 8 (the segmentation line SL) of the element substrate main body 11 as a base point.

(3) The second inorganic sealing layer 34c is covered with the transparent resin layer 42, and thus it is possible to suppress the occurrence of a damage in the second inorganic sealing layer 34c due to the scattering of minute offcuts (cullet) generated when forming the segmentation lines SL (cutting lines) in the mother substrate 11W.

(4) The planarization layer 34b is formed to be thick using a wet method of forming a film (solid) from a solution (liquid), and thus it is possible to reduce the influence of defective locations such as the bending of the element substrate main body 11, foreign substances, or a recessed defect (pinhole or crack) of the first inorganic sealing layer 34a. That is, the defective locations are covered with the planarization layer 34b, and thus a flat surface is formed. The second inorganic sealing layer 34c is formed on the surface that becomes flat by the planarization layer 34b, and thus a defect is less likely to be generated in the second inorganic sealing layer 34c.

(5) The planarization layer 34b is formed of a more flexible material (material having the Young's modulus of equal to or less than 100 GPa) than the first inorganic sealing layer 34a, and thus a crack is less likely to be generated in the planarization layer 34b even if the planarization layer 34b is formed to be thick.

(6) The planarization layer 34b is constituted by a dense film such as a metal oxide formed by a sol-gel method, a metal oxide formed of a solution including a silazane compound, and an epoxy resin formed of a resin solution, and thus it is possible to suppress the permeation of moisture, oxygen, or the like.

(7) According to (1) to (5) mentioned above, a barrier property of the sealing layer 34 is improved, and the deterioration of the organic EL element 30 due to moisture, oxygen, or the like is suppressed, and thus it is possible to provide the organic EL device 100 with high reliability.

Meanwhile, this embodiment can be applied not only to the segmentation into the simplex organic EL panels 1 from the mother substrate 11W in which the plurality of organic EL panels 1 are disposed, but also to the segmentation into the simplex element substrates 10 from the mother substrate 11W in which the plurality of element substrates 10 are disposed.

Second Embodiment

Outline of Organic EL Device

Figure 10:
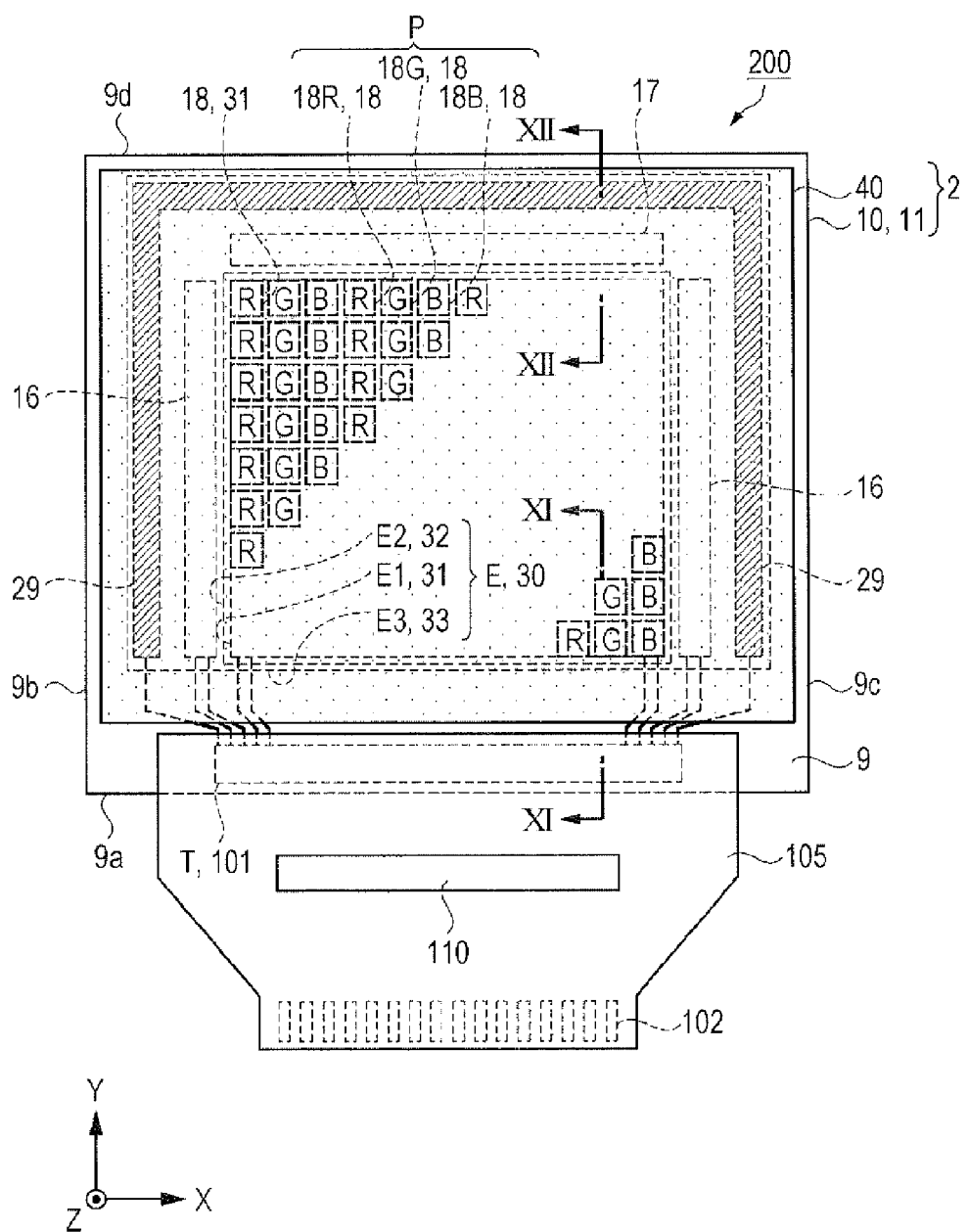
FIG. 10 is a schematic plan view showing the configuration of an organic EL device according to a second embodiment.
Figure 11:
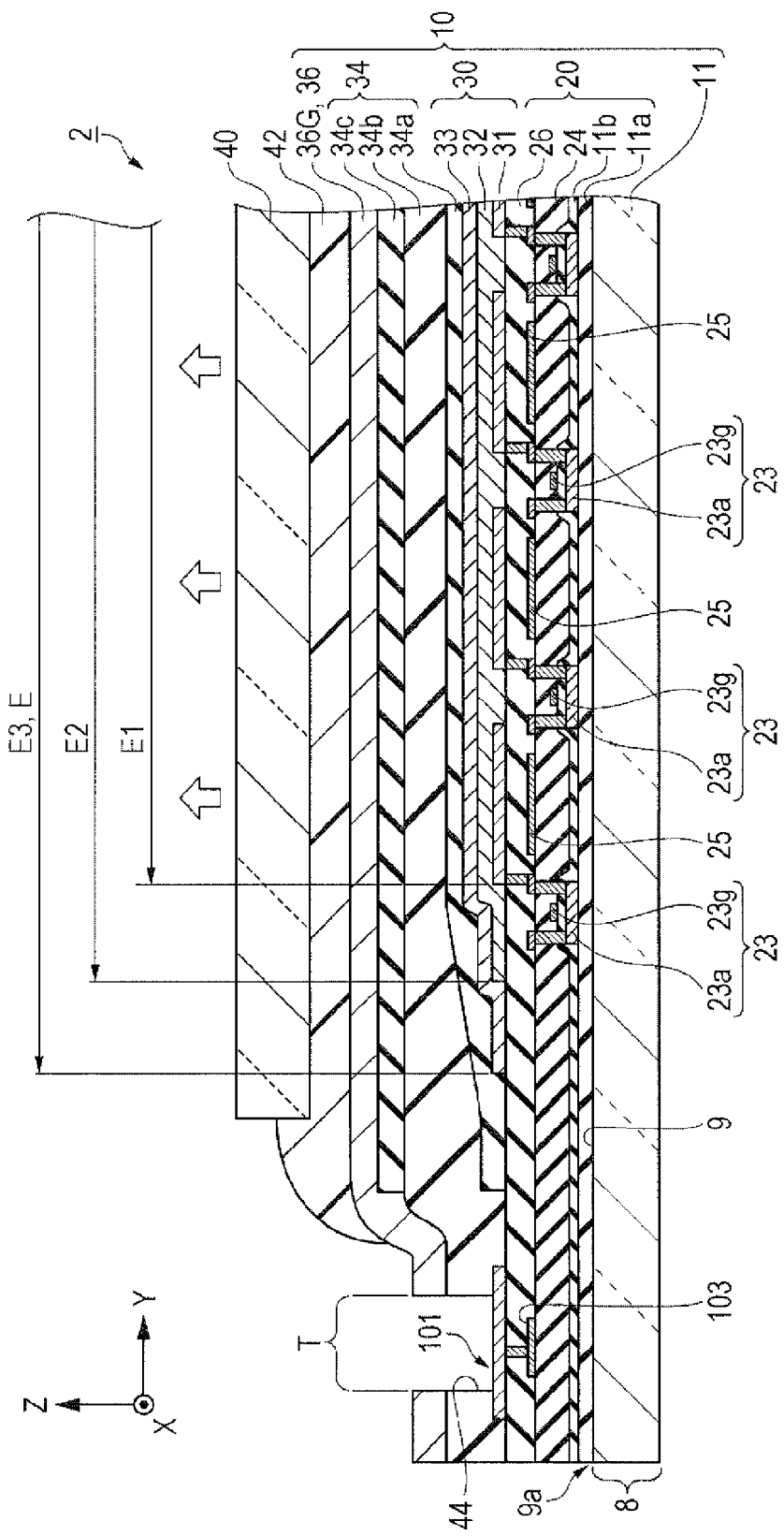
FIG. 11 is a schematic cross-sectional view of the organic EL panel taken along line XI-XI of FIG. 10.
Figure 12:
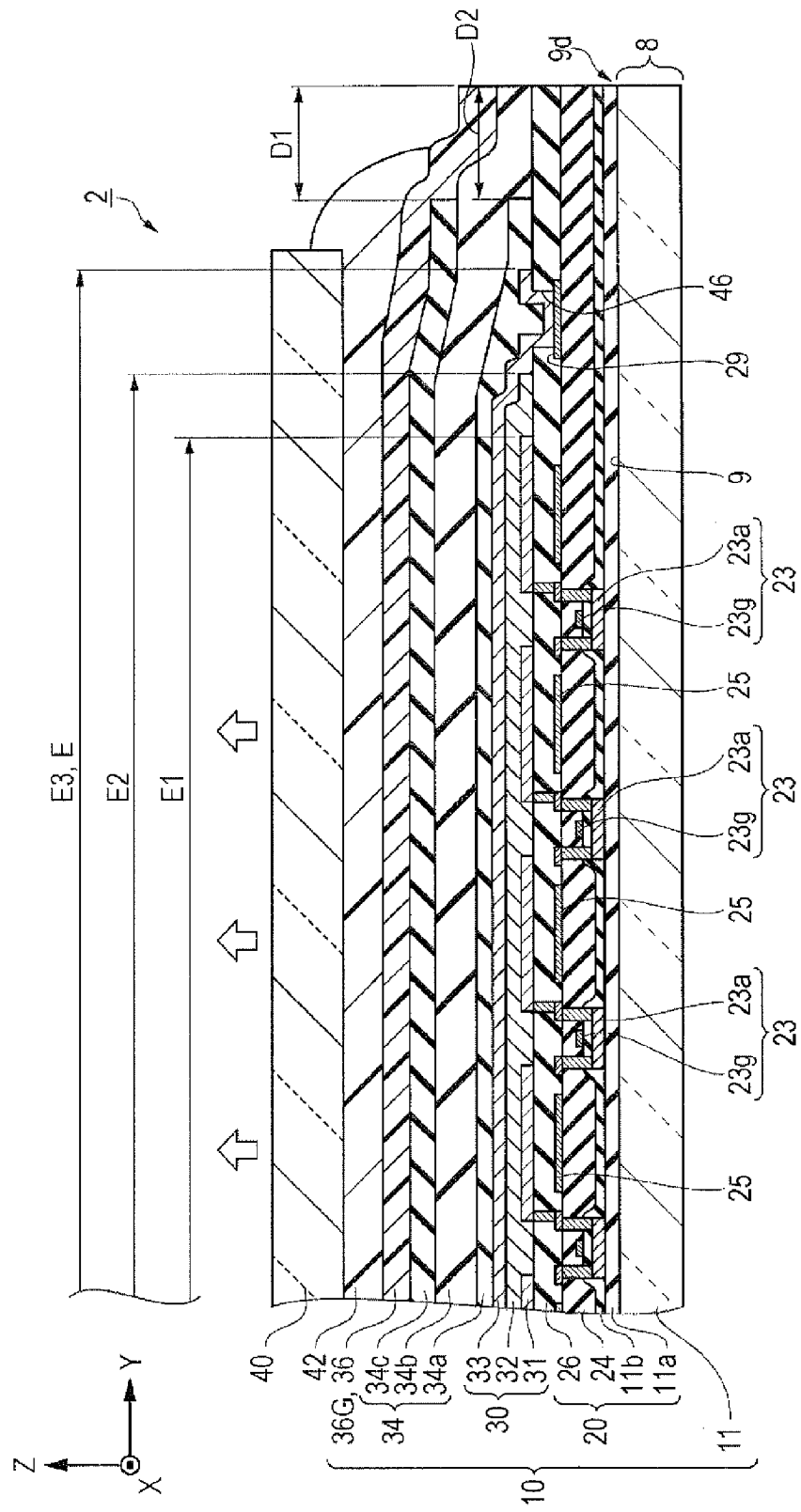
FIG. 12 is a schematic cross-sectional view of the organic EL panel taken along line XII-XII of FIG. 10.
Figure 13:
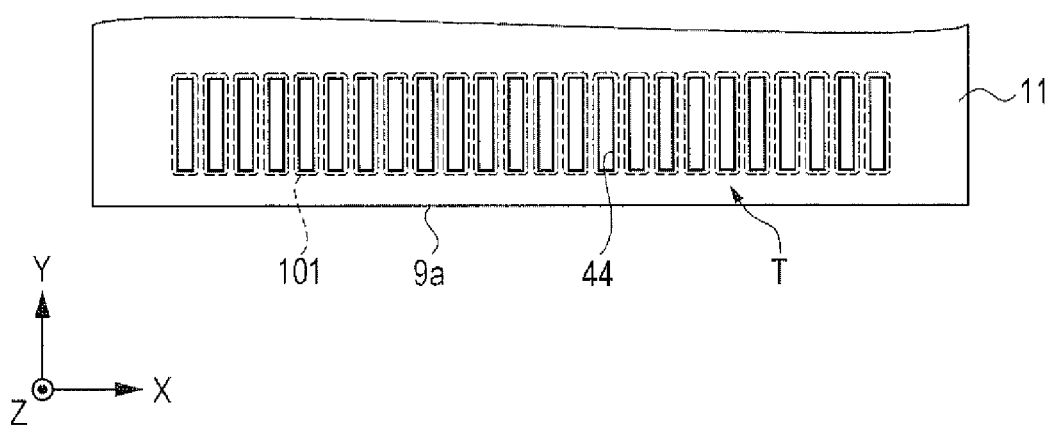
FIG. 13 is a schematic plan view of a terminal region of the organic EL device according to the second embodiment.

FIG. 10 is a schematic plan view showing the configuration of an organic EL device according to a second embodiment. FIG. 11 is a schematic cross-sectional view showing the structure of the organic EL panel taken along line XI-XI (green (G) colored layer) of FIG. 10. FIG. 12 is a schematic cross-sectional view showing the structure of the organic EL panel taken along line XII-XII (region in which a green colored layer is disposed) of FIG. 10. FIG. 13 is a schematic plan view of a terminal region.

Hereinafter, an organic EL device 200 according to this embodiment will be described with reference to FIGS. 10 to 13 focusing on the differences from the first embodiment. In addition, the same components as those in the first embodiment will be denoted by the same reference numerals, and repeated description will be omitted.

The main differences between this embodiment and the first embodiment are that the organic EL device 200 (an organic EL panel 2) according to this embodiment includes a color filter 36 constituted by red (R), green (G), and blue (B) colored layers and is capable of full-color display.

As shown in FIG. 10, pixels 18 emitting red (R), green (G), and blue (B) light beams are disposed in pixels 18 (pixel electrodes 31). The pixel 18 having a red (R) colored layer disposed therein and emitting the red (R) light is a pixel 18R. The pixel 18 having a green (G) colored layer 36G (FIG. 11) disposed therein and emitting the green (G) light is a pixel 18G. The pixel 18 having a blue (B) colored layer disposed therein and emitting the blue (B) light is a pixel 18B. The pixels 18R, the pixels 18G, and the pixels 18B are arrayed along a Y direction. That is, the organic EL panel 2 has the same color array (stripe color array) in the Y direction. In the organic EL panel 2, three pixels 18 (the pixel 18R, the pixel 18G, and the pixel 18B) which are arrayed in an X direction are set as a display unit P, and thus full-color display is provided.

Meanwhile, the array of the colored layers is not limited to the above-described stripe color array, and may be a color array (mosaic array or delta array) which is different in the Y direction, for example.

As shown in FIGS. 11 and 12, the green (G) colored layer 36G is disposed on a second inorganic sealing layer 34c. The green (G) colored layer 36G overlaps the pixel electrode 31 in a planar manner, and is disposed to be wider than the pixel electrode 31. As a result, in the pixel electrode 31 (the organic EL element 30) in which the green (G) colored layer 36G is disposed, green (G) light is emitted as display light. Although not shown in the drawing, a red (R) colored layer and a blue (B) colored layer are disposed on the second inorganic sealing layer 34c, in addition to the green (G) colored layer 36G. In the pixel electrode 31 (the organic EL element 30) in which the red (R) colored layer is disposed, red (G) light is emitted as display light, and in the pixel electrode 31 (the organic EL element 30) in which the blue (B) colored layer is disposed, blue (B) light is emitted as display light. In this manner, any one of the green (G) colored layer 36G, the red (R) colored layer, and the blue (B) colored layer is disposed on the second inorganic sealing layer 34c.

A protection substrate 40 covering a light emitting element region E is disposed above the green colored layer 36G (the color filter 36). A transparent resin layer 42 is disposed between the green colored layer 36G (the color filter 36) and the protection substrate 40. The green colored layer 36G (the color filter 36) and the protection substrate 40 are bonded to each other through the transparent resin layer 42.

As described above, the color filter 36 is constituted by the green (G) colored layer 36G, the red colored layer, and the blue colored layer. When viewed from a Z direction, the second inorganic sealing layer 34c is covered with at least one of the green (G) colored layer 36G, the red (R) colored layer, and the blue (B) colored layer. That is, the color filter 36 covers the second inorganic sealing layer 34c and is disposed on the entire surface 9 of an element substrate main body 11 except for a terminal region T. In the terminal region T, an opening 44 that exposes a terminal 101 is provided in the color filter 36.

The second inorganic sealing layer 34c is covered with the color filter 36, and thus it is possible to suppress a damage of the second inorganic sealing layer 34c due to the scattering of offcuts (cullet) generated when segmenting a mother substrate 11W into simplex organic EL panels 1.

The color filter 36 can be formed by applying, for example, a photosensitive resin material containing a coloring material to form a photosensitive resin layer and then by exposing and developing the photosensitive resin layer using a photolithographic method.

As shown in FIG. 11, an outer edge of a first inorganic sealing layer 34a is disposed between the terminal region T and the light emitting element region E (the protection substrate 40), that is, disposed further inside than an outer edge of a planarization layer 34b (between the outer edge of the planarization layer 34b and the light emitting element region E). As shown in FIG. 12, the outer edge of the first inorganic sealing layer 34a is disposed between a fourth side 9d (an end face 8) of the element substrate main body 11 and the light emitting element region E. Although not shown in the drawing, the outer edge of the first inorganic sealing layer 34a is disposed between a second side 9b (the end face 8) of the element substrate main body 11 and the light emitting element region E and between a third side 9c (the end face 8) of the element substrate main body 11 and the light emitting element region E. A distance D2 between the outer edge of the first inorganic sealing layer 34a and the fourth side 9d of the element substrate main body 11 is equal to or greater than 0.1 mm. Although not shown in the drawing, both a distance between the outer edge of the first inorganic sealing layer 34a and the second side 9b of the element substrate main body 11 and a distance between the outer edge of the first inorganic sealing layer 34a and the third side 9c of the element substrate main body 11 are similarly equal to or greater than 0.1 mm. That is, similarly to the second inorganic sealing layer 34c, the first inorganic sealing layer 34a is disposed more than 0.1 mm away from segmentation lines SL in the mother substrate 11W.

On the other hand, the first inorganic sealing layer 34a according to the first embodiment is disposed across the segmentation lines SL on the entire surface 9 of the element substrate main body 11 except for the terminal region T. That is, this embodiment is also different from the first embodiment in a region where the first inorganic sealing layer 34a is disposed.

In this embodiment, similarly to the second inorganic sealing layer 34c, the first inorganic sealing layer 34a is also disposed so as to be separated from the segmentation lines SL. Accordingly, similarly to the second inorganic sealing layer 34c, also in the first inorganic sealing layer 34a, the influence of stress occurring near the segmentation lines SL is suppressed, and thus the generation of a new defect in the second inorganic sealing layer 34c and the first inorganic sealing layer 34a is suppressed. Further, the influence of a plane defect (conchoidal defect, or the like) and a line defect (crack, or the like), which is generated in the surface 9 with the end face 8 of the element substrate main body 11 as a base point when segmenting the mother substrate 11W, is also suppressed, and thus the generation of a new defect in the second inorganic sealing layer 34c and the first inorganic sealing layer 34a is suppressed.

As shown in FIG. 11, the planarization layer 34b and the colored layer 36G (the color filter 36) are laminated in a peripheral edge of the terminal 101. The planarization layer 34b and the colored layer 36G (the color filter 36) are provided with the opening 44 that exposes the terminal 101. The opening 44 exposing the terminal 101 is formed by etching the planarization layer 34b using the colored layer 36G (the color filter 36) as an etching mask. On the other hand, in the first embodiment, the opening 45 exposing the terminal 101 is formed by etching the planarization layer 34b using a photoresist as an etching mask. Accordingly, in this embodiment, a photolithography process of forming the etching mask of the opening 45 in the first embodiment is simplified.

This embodiment is different from the first embodiment in the shape of the opening that exposes the terminal 101. As shown in FIG. 13, the opening 44 exposing the terminal 101 is provided in each of the plurality of terminals 101 that are disposed in the X direction. A region where the terminals 101 exposed by the openings 44 are disposed, that is, a region where the openings 44 are disposed is the terminal region T. The terminals 101 exposed by the openings 44 are electrically connected to an FPC 105 (see FIG. 2).

On the other hand, in the first embodiment, the openings 45 that collectively expose the plurality of terminals 101 are provided.

The red (R) colored layer, the blue (B) colored layer, and the like, in addition to the green (G) colored layer 36G, may be disposed (laminated) between the end face 8 of the element substrate main body 11 and the light emitting element region E. That is, at least one of the green (G) colored layer 36G, the red (R) colored layer, and the blue (B) colored layer may be disposed between the end face 8 of the element substrate main body 11 and the light emitting element region E.

Third Embodiment

Figure 14:
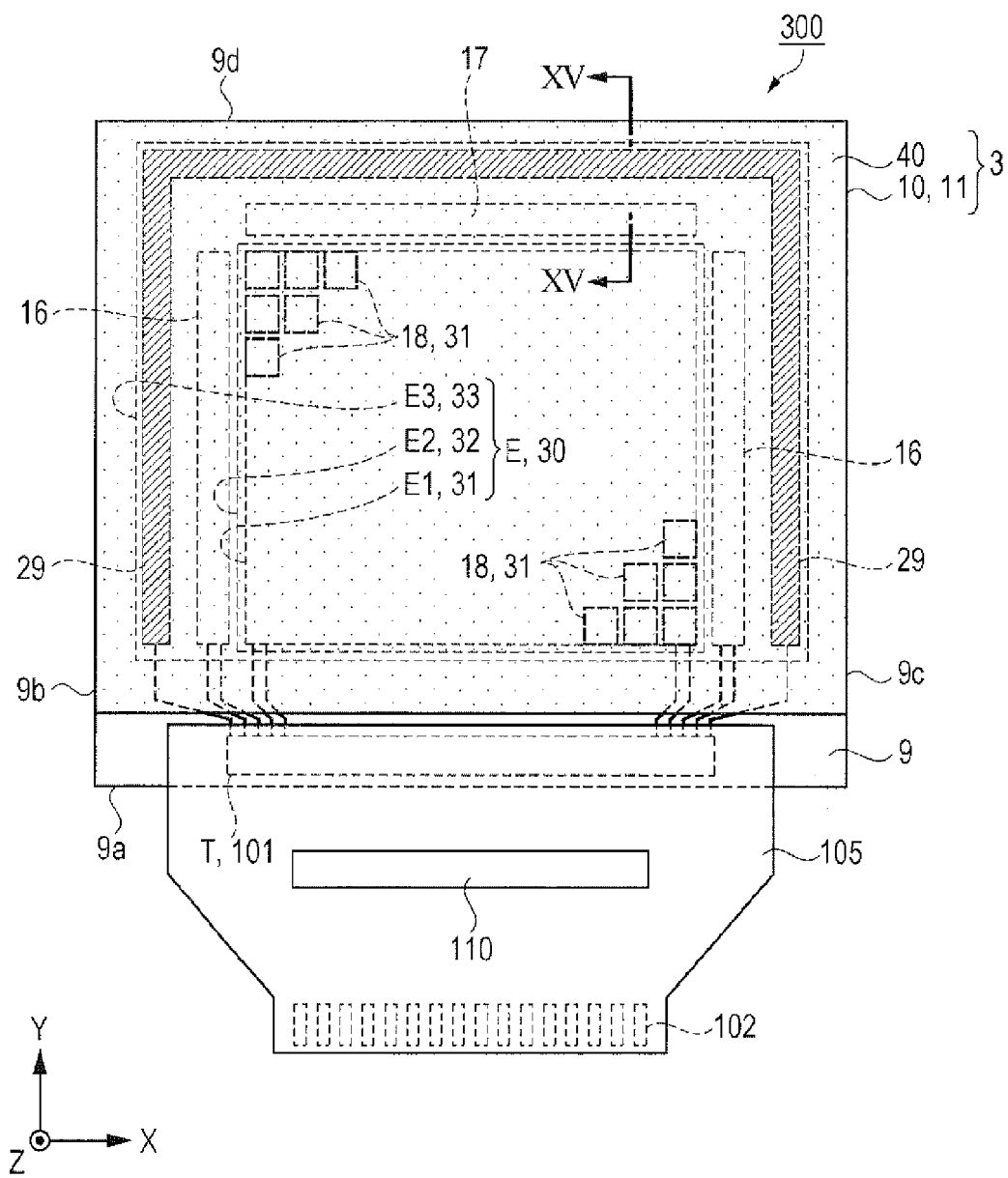
FIG. 14 is a schematic plan view of an organic EL device according to a third embodiment.
Figure 15:
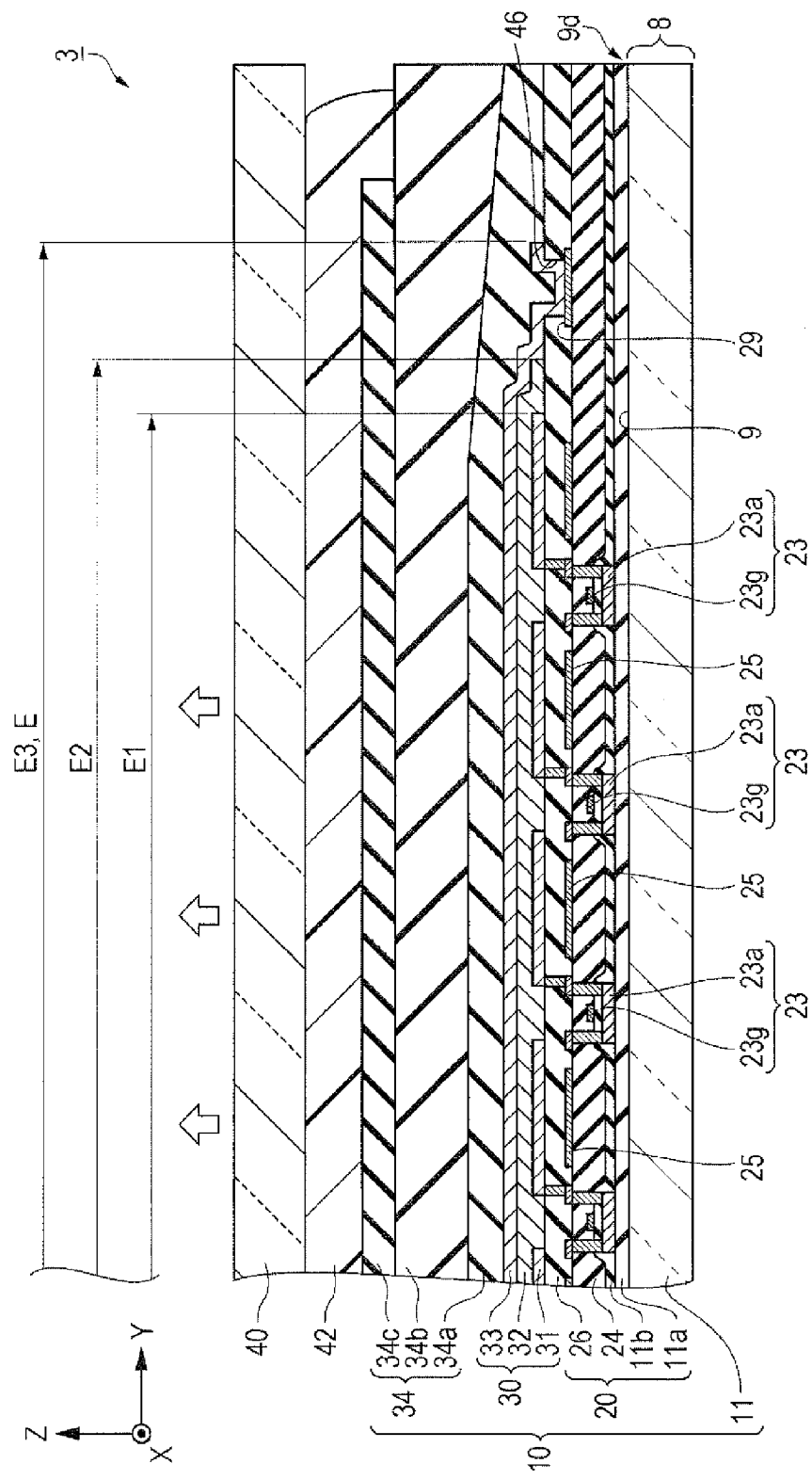
FIG. 15 is a schematic cross-sectional view of the organic EL panel taken along line XV-XV of FIG. 14.

FIG. 14 corresponds to FIG. 2 and is a schematic plan view of an organic EL device according to a third embodiment. FIG. 15 corresponds to FIG. 4 and is a schematic cross-sectional view showing the structure of the organic EL panel taken along line XV-XV of FIG. 14.

Hereinafter, an organic EL device 300 according to this embodiment will be described with reference to FIGS. 14 and 15 focusing on the differences from the first embodiment. In addition, the same components as those in the first embodiment will be denoted by the same reference numerals, and repeated description will be omitted.

In the organic EL device 300 according to this embodiment, the shape (size) of a protection substrate 40 is different from that in the first embodiment, and other configurations are the same as those in the first embodiment.

In the first embodiment, the protection substrate 40 is attached to each of the plurality of element substrates 10 using a method of attaching the simplex protection substrate 40 to the mother substrate 11W in which the plurality of element substrates 10 are formed, that is, a chip mount method. In this embodiment, an element substrate 10 is attached to the protection substrate 40 using a method of attaching a mother substrate, having the plurality of element substrates 10 formed therein, to a mother substrate serving as the protection substrate 40, that is, a large-sized plate laminating method, to form a mother substrate 11W in which a plurality of organic EL panels 3 are disposed. Then, the mother substrate 11W is segmented along segmentation lines SL, and thus the simplex organic EL panel 3 shown in FIGS. 14 and 15 is formed.

As shown in FIG. 14, a portion of an outer edge of the protection substrate 40 is disposed between a terminal region T and a light emitting element region E, and has the same configuration as that in the first embodiment.

As shown in FIG. 15, the outer edge of the protection substrate 40 and a fourth side 9d of an element substrate main body 11 are disposed at substantially the same position. Although not shown in the drawing, the outer edge of the protection substrate 40 and a second side 9b of the element substrate main body 11, and the outer edge of the protection substrate 40 and a third side 9c of the element substrate main body 11 are disposed at substantially the same position. In the first embodiment, the outer edge of the protection substrate 40 is disposed between the fourth side 9d of the element substrate main body 11 and the light emitting element region E, between the second side 9b and the light emitting element region E, and between the third side 9c and the light emitting element region E. In this manner, the protection substrate 40 according to this embodiment is larger than the protection substrate 40 according to the first embodiment, and thus this embodiment is different from the first embodiment in the position at which the outer edge of the protection substrate 40 is disposed.

In this embodiment, the element substrate 10 is attached to the protection substrate 40 using a method of attaching the mother substrate, having the plurality of element substrates 10 formed therein, to a mother substrate in which the plurality of protection substrates 40 are disposed (large-sized plate laminating method), and thus it is possible to increase a processing speed at which the element substrate 10 is attached to the protection substrate 40 (productivity can be improved) as compared with a method of attaching the simplex protection substrate 40 to the mother substrate 11W in which the plurality of element substrates 10 are formed (chip mount method).

As described above, the protection substrate 40 has a role of protecting an organic EL element 30 so as not to be mechanically impacted and not to be affected by external atmosphere, and thus the protection substrate 40 may be disposed so as to cover the light emitting element region E. For this reason, the outer edge of the protection substrate 40 may protrude from the element substrate 10. In contrast, an outer edge of the element substrate may protrude from the protection substrate 40.

Further, a method of attaching the element substrate 10 and the protection substrate 40 to each other may be a method of attaching the simplex protection substrate 40 to the simplex element substrate 10.

Fourth Embodiment

FIGS. 16A to 16E are schematic plan views showing preferred examples of a first inorganic sealing layer and a planarization layer. FIGS. 17A to 17C are schematic plan views showing a preferred example of a second inorganic sealing layer. FIGS. 16A to 16E show an element substrate main body 11, a first inorganic sealing layer 34a, and a planarization layer 34b and do not show other components. FIGS. 17A to 17C show the element substrate main body 11 and a second inorganic sealing layer 34c and do not show other components.

A first side 9a, a second side 9b, a third side 9c, and a fourth side 9d of the element substrate main body 11 which are shown in the drawing correspond to segmentation lines SL in a mother substrate 11W. In the first inorganic sealing layer 34a, the planarization layer 34b, and the second inorganic sealing layer 34c, an outer edge along the first side 9a, an outer edge along the second side 9b, an outer edge along the third side 9c, and an outer edge along the fourth side 9d are denoted by reference numbers and signs 7a, 7b, 7c, and 7d, respectively.

The invention has an effective configuration in order to suppress the generation of a new defect in a sealing layer 34 due to stress acting along the segmentation line SL when segmenting the mother substrate 11W, a defect (conchoidal defect, crack, or the like) which is generated with a segmented plane as a base point, or the like. Hereinafter, the details will be described with reference to FIGS. 16A to 16E and FIGS. 17A to 17C.

Preferred Examples of First Inorganic Sealing Layer and Planarization Layer

Figure 16A:
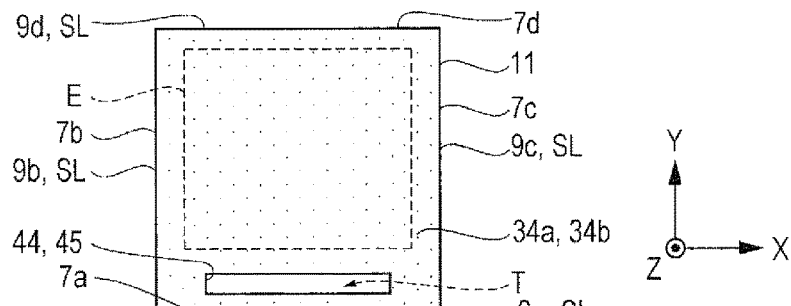
FIGS. 16A to 16E are schematic plan views showing preferred examples of a first inorganic sealing layer and a planarization layer.
Figure 17A:
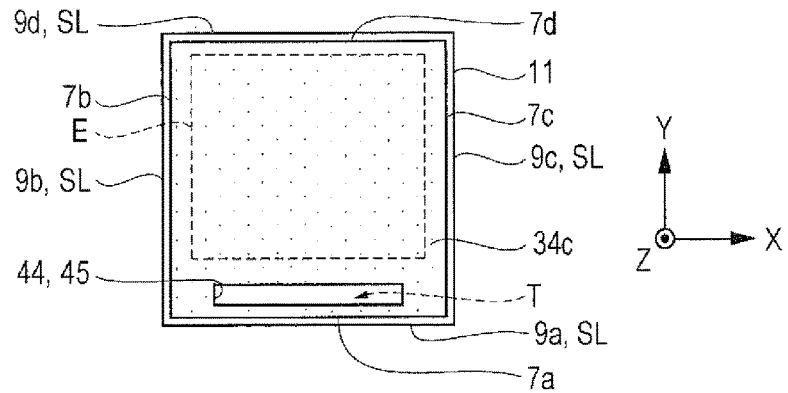
FIGS. 17A to 17C are schematic plan views showing a preferred example of a second inorganic sealing layer.
Figure 17B:
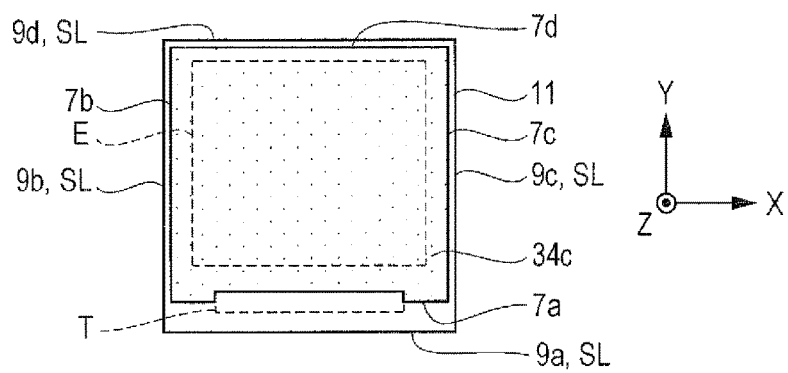
Figure 17C:
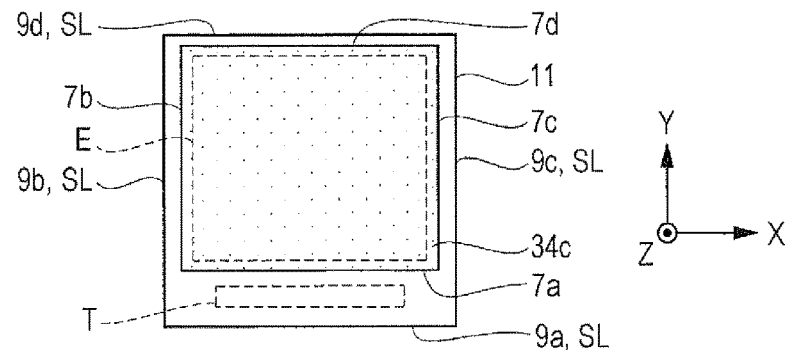

As shown in FIG. 16A, the first inorganic sealing layer 34a and the planarization layer 34b are disposed in the element substrate main body 11 so that the outer edges 7a, 7b, 7c, and 7d of the first inorganic sealing layer 34a and the planarization layer 34b conform with the outer edge (the first side 9a, the second side 9b, the third side 9c, and the fourth side 9d) of the element substrate main body 11. That is, the first inorganic sealing layer 34a and the planarization layer 34b are disposed on the entire surface of the element substrate main body 11 except for a terminal region T, across the segmentation lines SL in the mother substrate 11W.

Further, the first inorganic sealing layer 34a and the planarization layer 34b are provided with an opening 44 (or an opening 45) which exposes a terminal 101 in the terminal region T.

Figure 16B:
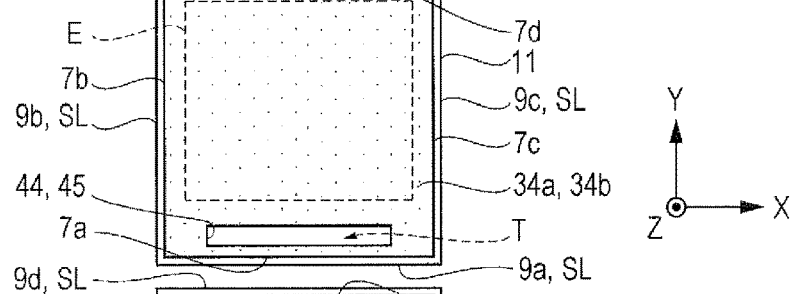

As shown in FIG. 16B, the side 7a along the first side 9a of the outer edge of the first inorganic sealing layer 34a and the outer edge of the planarization layer 34b is disposed between the first side 9a and the terminal region T. The side 7b along the second side 9b of the outer edge of the first inorganic sealing layer 34a and the outer edge of the planarization layer 34b is disposed between the second side 9b and the light emitting element region E. The side 7c along the third side 9c of the outer edge of the first inorganic sealing layer 34a and the outer edge of the planarization layer 34b is disposed between the third side 9c and the light emitting element region E. The side 7d along the fourth side 9d of the outer edge of the first inorganic sealing layer 34a and the outer edge of the planarization layer 34b is disposed between the fourth side 9d and the light emitting element region E.

Further, the first inorganic sealing layer 34a and the planarization layer 34b are provided with the opening 44 (or the opening 45) which exposes the terminal 101 in the terminal region T.

Figure 16C:
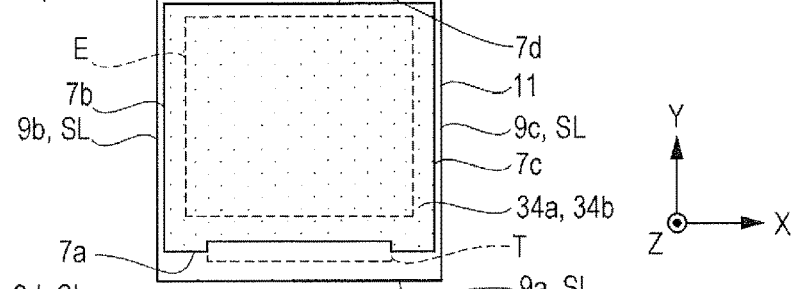

As shown in FIG. 16C, the side 7a along the first side 9a of the outer edge of the first inorganic sealing layer 34a and the outer edge of the planarization layer 34b is disposed across the terminal region T. The side 7b along the second side 9b of the outer edge of the first inorganic sealing layer 34a and the outer edge of the planarization layer 34b is disposed between the second side 9b and the light emitting element region E. The side 7c along the third side 9c of the outer edge of the first inorganic sealing layer 34a and the outer edge of the planarization layer 34b is disposed between the third side 9c and the light emitting element region E. The side 7d along the fourth side 9d of the outer edge of the first inorganic sealing layer 34a and the outer edge of the planarization layer 34b is disposed between the fourth side 9d and the light emitting element region E.

Meanwhile, the side 7a along the first side 9a of the outer edge of the first inorganic sealing layer 34a and the outer edge of the planarization layer 34b is recessed in the terminal region T in order to expose the terminal 101.

Figure 16D:
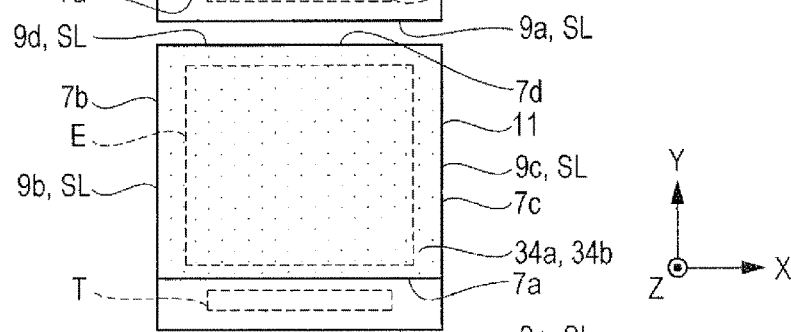

As shown in FIG. 16D, the side 7a along the first side 9a of the outer edge of the first inorganic sealing layer 34a and the outer edge of the planarization layer 34b is disposed between the terminal region T and the light emitting element region E. The side 7b along the second side 9b of the outer edge of the first inorganic sealing layer 34a and the outer edge of the planarization layer 34b is disposed at the same position as the second side 9b. The side 7c along the third side 9c of the outer edge of the first inorganic sealing layer 34a and the outer edge of the planarization layer 34b is disposed at the same position as the third side 9c. The side 7d along the fourth side 9d of the outer edge of the first inorganic sealing layer 34a and the outer edge of the planarization layer 34b is disposed at the same position as the fourth side 9d.

Figure 16E:
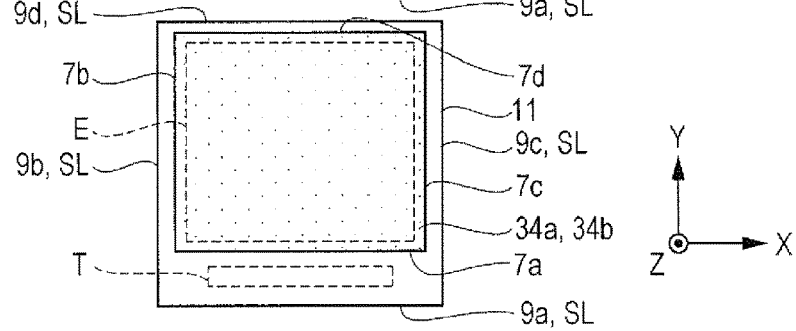

As shown in FIG. 16E, the side 7a along the first side 9a of the outer edge of the first inorganic sealing layer 34a and the outer edge of the planarization layer 34b is disposed between the terminal region T and the light emitting element region E. The side 7b along the second side 9b of the outer edge of the first inorganic sealing layer 34a and the outer edge of the planarization layer 34b is disposed between the second side 9b and the light emitting element region E. The side 7c along the third side 9c of the outer edge of the first inorganic sealing layer 34a and the outer edge of the planarization layer 34b is disposed between the third side 9c and the light emitting element region E. The side 7d along the fourth side 9d of the outer edge of the first inorganic sealing layer 34a and the outer edge of the planarization layer 34b is disposed between the fourth side 9d and the light emitting element region E.

The first inorganic sealing layer 34a and the planarization layer 34b may have the above-described shapes shown in FIGS. 16A to 16E. In addition, the first inorganic sealing layer 34a may be larger or smaller than the planarization layer 34b. For example, the first inorganic sealing layer 34a has the shape shown in FIG. 16A, and the planarization layer 34b has the shape shown in FIG. 16E. In short, it is important for the first inorganic sealing layer 34a and the planarization layer 34b to cover the light emitting element region E and to be disposed to be wider than the light emitting element region E.

As shown in FIG. 14A, the first inorganic sealing layer 34a and the planarization layer 34b may be disposed across the segmentation lines SL of the mother substrate 11W. However, as shown in FIGS. 14B and 14E, it is preferable that the outer edges of the first inorganic sealing layer 34a and the planarization layer 34b be separated from the segmentation lines SL of the mother substrate 11W. That is, the outer edges of the first inorganic sealing layer 34a and the planarization layer 34b are disposed so as to be separated from the segmentation lines SL of the mother substrate 11W, and thus it is possible to make it harder for a new defect to be generated in the first inorganic sealing layer 34a and the planarization layer 34b when segmenting the mother substrate 11W, which leads to preferable results.

Preferred Example of Second Inorganic Sealing Layer

As shown in FIG. 17A, the side 7a along the first side 9a of the outer edge of the second inorganic sealing layer 34c is disposed between the first side 9a and the terminal region T. The side 7b along the second side 9b of the outer edge of the second inorganic sealing layer 34c is disposed between the second side 9b and the light emitting element region E. The side 7c along the third side 9c of the outer edge of the second inorganic sealing layer 34c is disposed between the third side 9c and the light emitting element region E. The side 7d along the fourth side 9d of the outer edge of the second inorganic sealing layer 34c is disposed between the fourth side 9d and the light emitting element region E.

Further, the second inorganic sealing layer 34c is provided with the opening 44 (or the opening 45) which exposes the terminal 101 in the terminal region T.

As shown in FIG. 17B, the side 7a along the first side 9a of the outer edge of the second inorganic sealing layer 34c is disposed across the terminal region T. The side 7b along the second side 9b of the outer edge of the second inorganic sealing layer 34c is disposed between the second side 9b and the light emitting element region E. The side 7c along the third side 9c of the outer edge of the second inorganic sealing layer 34c is disposed between the third side 9c and the light emitting element region E. The side 7d along the fourth side 9d of the outer edge of the second inorganic sealing layer 34c is disposed between the fourth side 9d and the light emitting element region E.

Meanwhile, the side 7a along the first side 9a of the outer edge of the second inorganic sealing layer 34c is recessed in the terminal region T in order to expose the terminal 101.

As shown in FIG. 17C, the side 7a along the first side 9a of the outer edge of the second inorganic sealing layer 34c is disposed between the terminal region T and the light emitting element region E. The side 7b along the second side 9b of the outer edge of the second inorganic sealing layer 34c is disposed between the second side 9b and the light emitting element region E. The side 7c along the third side 9c of the outer edge of the second inorganic sealing layer 34c is disposed between the third side 9c and the light emitting element region E. The side 7d along the fourth side 9d of the outer edge of the second inorganic sealing layer 34c is disposed between the fourth side 9d and the light emitting element region E.

The second inorganic sealing layer 34c may have the above-described shapes shown in FIGS. 17A to 17C. In addition, the second inorganic sealing layer 34c may be larger or smaller than the first inorganic sealing layer 34a. Further, the second inorganic sealing layer 34c may have a smaller formation range than that of the planarization layer 34b. However, as shown in FIGS. 17B and 17C, when a distance between the outer edges of the planarization layer 34b and the second inorganic sealing layer 34c and the segmentation line SL can be sufficiently secured by the arrangement or the like of the terminal region T between the outer edge 7a of the planarization layer 34b and the outer edge 9a of the element substrate main body 11 and between the outer edge 7a of the second inorganic sealing layer 34c and the outer edge 9a of the element substrate main body 11, the outer edge of the planarization layer 34b may be matched to the outer edge of the second inorganic sealing layer 34c. Alternatively, the outer edge 7a of the second inorganic sealing layer 34c may be located between the outer edge 7a of the planarization layer 34b and the outer edge 9a of the element substrate main body 11. In short, similarly to the first inorganic sealing layer 34a and the planarization layer 34b, it is important for the second inorganic sealing layer 34c to be disposed to be wider than the light emitting element region E and for the outer edge of the second inorganic sealing layer 34c to be disposed further inside (the light emitting element region E side) than the outer edge of the planarization layer 34b when a distance between the outer edge of the second inorganic sealing layer 34c and the segmentation line SL cannot be sufficiently secured.

Fifth Embodiment

Electronic Apparatus

Figure 18A:
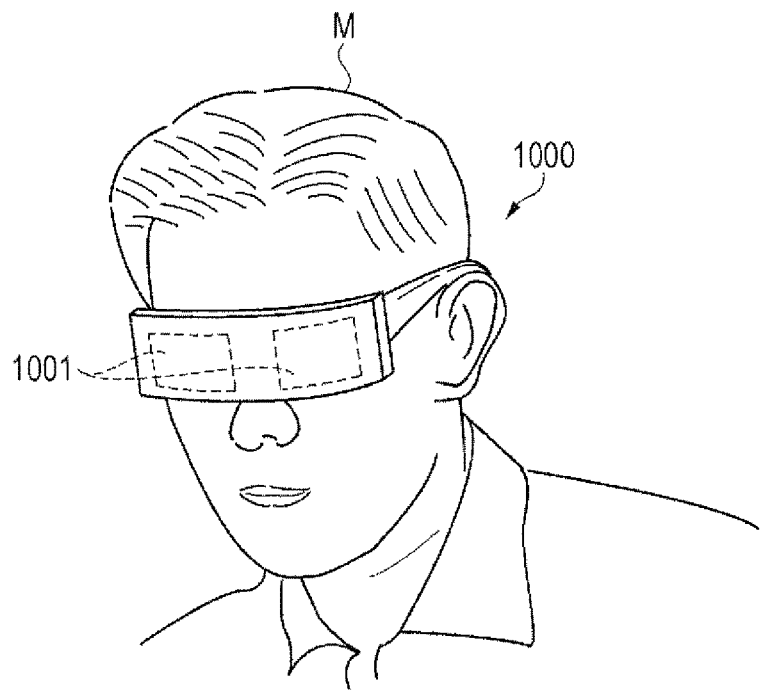
FIG. 18A is a schematic view of a head mounted display.
Figure 18B:
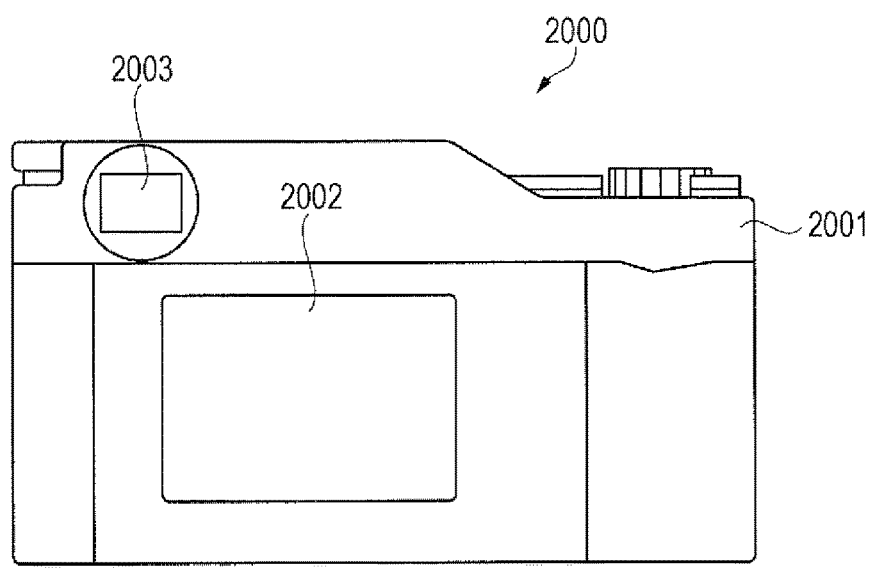
FIG. 18B is a schematic view of a digital camera.

FIG. 18A is a schematic view of a head mounted display (HMD) as an electronic apparatus. FIG. 18B is a schematic view of a digital camera as an electronic apparatus. Hereinafter, an electronic apparatus equipped with the organic EL device according to any one of the above-described embodiments will be described with reference to FIGS. 18A and 18B.

As shown in FIG. 18A, a head mounted display (HMD) 1000 has two display units 1001 that are provided so as to correspond to right and left eyes. An observer M wears the head mounted display 1000 on the head like glasses, and thus the observer can view characters, images, and the like that are displayed on the display unit 1001. For example, when an image taking parallax into consideration is displayed on the display unit 1001, the observer can also view and enjoy a stereoscopic image.

The display unit 1001 is equipped with the organic EL device 100 according to the first embodiment, the organic EL device 200 according to the second embodiment, or the organic EL device 300 according to the third embodiment.

The organic EL device 100 according to the first embodiment, the organic EL device 200 according to the second embodiment, or the organic EL device 300 according to the third embodiment has high reliability because the influence of external atmosphere such as moisture and oxygen is suppressed, and thus it is possible to provide the head mounted display 1000 with high reliability.

As shown in FIG. 183, a digital camera 2000 includes a main body 2001 having an optical system such as an imaging device. The main body 2001 is provided with a monitor 2002 that displays a captured image and the like, and an electronic view finder 2003 for viewing a subject. The monitor 2002 and the electronic view finder are equipped with the organic EL device 100 according to the first embodiment, the organic EL device 200 according to the second embodiment, or the organic EL device 300 according to the third embodiment. The organic EL device 100 according to the first embodiment, the organic EL device 200 according to the second embodiment, or the organic EL device 300 according to the third embodiment has high reliability because the influence of external atmosphere such as moisture and oxygen is suppressed, and thus it is possible to provide the digital camera 2000 with high reliability.

Meanwhile, the electronic apparatus equipped with the organic EL device 100, the organic EL device 200, or the organic EL device 300 is not limited to the head mounted display 1000 and the digital camera 2000 which are described above. Examples of the electronic apparatus may include an electronic apparatus including a display unit such as a personal computer, a portable information terminal, a navigator, a viewer, or a head-up display.

The entire disclosure of Japanese Patent Application No. 2013-123468, filed Jun. 12, 2013 is expressly incorporated by reference herein.

What is claimed is:

1. An electro-optic device comprising:
a substrate that has a first surface and an end face crossing the first surface;
a light emitting element that is disposed on the first surface;
a planarization layer that covers the light emitting element; and
a first inorganic sealing layer that is disposed on the planarization layer, wherein
an outer edge of the first inorganic sealing layer is disposed between an outer edge of the planarization layer and a first region where the light emitting element is disposed such that a distance between the outer edge of the first inorganic sealing layer and the outer edge of the planarization layer is equal to or greater than 0.1 mm,
the first surface has a first side, a second side and a third side which cross the first side, and a fourth side that faces the first side,
a terminal, disposed on the first surface along the first side, is provided between the first side and the first region,
the planarization layer has an opening that exposes the terminal, the outer edge of the planarization layer forms a side of the opening,
the outer edge of the planarization layer is disposed (i) between the first side of the first surface of the substrate and a second region where the terminal is disposed in the opening, (ii) between the second side and the first region, (iii) between the third side and the first region, and (iv) between the fourth side and the first region,
the first inorganic sealing layer has an outer edge along the first side, an outer edge along the second side, an outer edge along the third side, and an outer edge along the fourth side,
the outer edge along the first side of the first inorganic sealing layer is disposed between the first region and the second region, and
the outer edge along the second side, the outer edge along the third side, and the outer edge along the fourth side of the first inorganic sealing layer are disposed between the end face and the first region.

2. The electro-optic device according to claim 1, further comprising a second inorganic sealing layer that covers the first region, between the light emitting element and the planarization layer, wherein an outer edge of the second inorganic sealing layer is disposed between the outer edge of the planarization layer and the first region.

3. The electro-optic device according to claim 2, wherein
the outer edge of the second inorganic sealing layer is disposed between the first side and the second region where the terminal is disposed, between the second side and the first region, between the third side and the first region, and between the fourth side and the first region, and
the second inorganic sealing layer has an opening that exposes the terminal.

4. An electronic apparatus comprising the electro-optic device according to claim 3.

5. An electronic apparatus comprising the electro-optic device according to claim 2.

6. The electro-optic device according to claim 1, wherein the outer edge of the first inorganic sealing layer is more than 0.1 mm away from the end face.

7. The electro-optic device according to claim 2, wherein the outer edge of the second inorganic sealing layer is more than 0.1 mm away from the end face.

8. An electronic apparatus comprising the electro-optic device according to claim 7.

9. An electronic apparatus comprising the electro-optic device according to claim 6.

10. The electro-optic device according to claim 1, further comprising:
a protection substrate that is disposed above the first inorganic sealing layer so as to cover the first region; and
an adhesion layer that is disposed between the first inorganic sealing layer and the protection substrate, wherein the first inorganic sealing layer is covered with the adhesion layer.

11. The electro-optic device according to claim 1, further comprising a color filter that has a red colored layer, a green colored layer, and a blue colored layer, on the first inorganic sealing layer, wherein the first inorganic sealing layer is covered with at least one of the red colored layer, the green colored layer, and the blue colored layer.

12. The electro-optic device according to claim 11, further comprising:
a protection substrate that is disposed above the color filter so as to cover the first region; and
an adhesion layer that is disposed between the color filter and the protection substrate.

13. The electro-optic device according to claim 1, wherein the planarization layer is constituted by any one of a metal oxide formed of polysilazane or formed by a sol-gel method and an epoxy resin.

14. The electro-optic device according to claim 1, wherein
the Young's modulus of the planarization layer is equal to or less than 100 GPa, and
the Young's modulus of the first inorganic sealing layer is in a range of 140 GPa to 200 GPa.

15. An electronic apparatus comprising the electro-optic device according to claim 1.

16. A method of manufacturing an electro-optic device that includes a substrate, including a light emitting element, a planarization layer, and a first inorganic sealing layer, a protection substrate that is disposed so as to face the substrate, and an adhesion layer that is disposed between the substrate and the protection substrate, the method comprising:
forming the planarization layer that covers a first region where the light emitting element is disposed;
forming the first inorganic sealing layer that covers at least a portion of the planarization layer so that an outer edge of the first inorganic sealing layer is disposed between the first region and an outer edge of the planarization layer such that a distance between the outer edge of the first inorganic sealing layer and the outer edge of the planarization layer is equal to or greater than 0.1 mm;
performing oxygen plasma processing on the first inorganic sealing layer;
disposing an adhesive material between the first inorganic sealing layer and the protection substrate;
hardening the adhesive material while pressing the protection substrate to form the adhesion layer that covers the first inorganic sealing layer; and
attaching the protection substrate to the substrate through the adhesion layer, wherein
the first surface has a first side, a second side and a third side which cross the first side, and a fourth side that faces the first side,
a terminal, disposed on the first surface along the first side, is provided between the first side and the first region,
the planarization layer has an opening that exposes the terminal, the outer edge of the planarization layer forms a side of the opening,
the outer edge of the planarization layer is disposed (i) between the first side of the first surface of the substrate and a second region where the terminal is disposed in the opening, (ii) between the second side and the first region, (iii) between the third side and the first region, and (iv) between the fourth side and the first region,
the first inorganic sealing layer has an outer edge along the first side, an outer edge along the second side, an outer edge along the third side, and an outer edge along the fourth side,
the outer edge along the first side of the first inorganic sealing layer is disposed between the first region and the second region, and
the outer edge along the second side, the outer edge along the third side, and the outer edge along the fourth side of the first inorganic sealing layer are disposed between the end face and the first region.

17. A method of manufacturing an electro-optic device using a mother substrate in which a plurality of electro-optic devices are disposed, each of the electro-optic devices having a light emitting element, a planarization layer, and a first inorganic sealing layer which are sequentially laminated, the method comprising:
forming the planarization layer, covering the light emitting element, in the mother substrate across segmentation lines that segment the mother substrate into the simplex electro-optic devices;
forming the first inorganic sealing layer, facing the light emitting element with the planarization layer interposed therebetween, in each of the plurality of disposed electro-optic devices so as to be more than 0.1 mm away from the segmentation lines and so that a distance between an outer edge of the first inorganic sealing layer and an outer edge of the planarization layer is equal to or greater than 0.1 mm; and
segmenting the mother substrate along the segmentation lines, wherein
the first surface has a first side, a second side and a third side which cross the first side, and a fourth side that faces the first side,
a terminal, disposed on the first surface along the first side, is provided between the first side and the first region,
the planarization layer has an opening that exposes the terminal, the outer edge of the planarization layer forms a side of the opening,
the outer edge of the planarization layer is disposed (i) between the first side of the first surface of the substrate and a second region where the terminal is disposed in the opening, (ii) between the second side and the first region, (iii) between the third side and the first region, and (iv) between the fourth side and the first region,
the first inorganic sealing layer has an outer edge along the first side, an outer edge along the second side, an outer edge along the third side, and an outer edge along the fourth side,
the outer edge along the first side of the first inorganic sealing layer is disposed between the first region and the second region, and
the outer edge along the second side, the outer edge along the third side, and the outer edge along the fourth side of the first inorganic sealing layer are disposed between the end face and the first region.

18. An electro-optic device comprising:
a substrate that has a first surface and an end face crossing the first surface;
a light emitting element that is disposed on the first surface;
a planarization layer that covers the light emitting element;
a first inorganic sealing layer that is disposed on the planarization layer; and
a second inorganic sealing layer that covers the first region, between the light emitting element and the planarization layer, wherein
an outer edge of the first inorganic sealing layer is disposed between an outer edge of the planarization layer and a first region where the light emitting element is disposed such that a distance between the outer edge of the first inorganic sealing layer and the outer edge of the planarization layer is equal to or greater than 0.1 mm,
an outer edge of the second inorganic sealing layer is disposed between the outer edge of the planarization layer and the first region, the first surface has a first side, a second side and a third side which cross the first side, and a fourth side that faces the first side, a terminal, disposed on the first surface along the first side, is provided between the first side and the first region, the outer edge of the second inorganic sealing layer is disposed between the first side and a second region where the terminal is disposed, between the second side and the first region, between the third side and the first region, and between the fourth side and the first region, the second inorganic sealing layer has an opening that exposes the terminal, the planarization layer has an opening that exposes the terminal, the outer edge of the planarization layer forms a side of the opening, and the outer edge of the planarization layer is disposed (i) between the first side of the first surface of the substrate and the second region where the terminal is disposed in the opening, (ii) between the second side and the first region, (iii) between the third side and the first region, and (iv) between the fourth side and the first region.

* * * * *